(12) United States Patent
Bouchard et al.

(10) Patent No.: US 12,640,108 B2
(45) Date of Patent: May 26, 2026

(54) HYBRID EMISSIVE/TRANSMISSIVE DISPLAYS AND COMBINATION DISPLAYS INCLUDING E PAPER AND HYBRID EMISSIVE/TRANSMISSIVE DISPLAYS

(71) Applicant: E INK CORPORATION, Billerica, MA (US)

(72) Inventors: Alain Bouchard, Boston, MA (US); Dirk Hertel, Quincy, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 18/895,600

(22) Filed: Sep. 25, 2024

(65) Prior Publication Data

US 2025/0111832 A1      Apr. 3, 2025

Related U.S. Application Data

(60) Provisional application No. 63/541,513, filed on Sep. 29, 2023.

(51) Int. Cl.
*G09G 3/34* (2006.01)
*G02F 1/167* (2019.01)
(Continued)

(52) U.S. Cl.
CPC .............. *G09G 3/344* (2013.01); *G02F 1/167* (2013.01); *G02F 1/1685* (2019.01);
(Continued)

(58) Field of Classification Search
CPC .............. G09G 3/344; G09G 2360/144; G09G 2300/02; G09G 2300/023;
(Continued)

(56) References Cited

U.S. PATENT DOCUMENTS 4,418,346 A      11/1983   Batchelder
5,872,552 A       2/1999   Gordon, II et al.
(Continued)

FOREIGN PATENT DOCUMENTS

WO      2000036560 A1      6/2000

OTHER PUBLICATIONS

Kitamura, T. et al., "Electrical toner movement for electronic paper-like display", Asia Display/IDW '01, pp. 1517-1520, Paper HCS1-1 (2001).

(Continued)

*Primary Examiner* — Douglas Wilson
(74) *Attorney, Agent, or Firm* — Brian D. Bean

(57)      ABSTRACT

A hybrid display including an emissive display adjacent a variable transmission display. The hybrid display device typically includes a controller. The emissive display provides an image that is viewable from a viewing location, and the variable transmission medium is positioned relative to the emissive display to partially alter the image at the viewing location. The controller generates a desired altered image at the viewing location by controlling the electrophoretic image display or the variable transmission medium. The display device can include an ambient light sensor. The hybrid display can be incorporated into a combination display by combining the hybrid display with one or more additional electrophoretic displays.

9 Claims, 9 Drawing Sheets

(51) Int. Cl.

| | |
|---|---|
| *G02F 1/1675* | (2019.01) |
| *G02F 1/16757* | (2019.01) |
| *G02F 1/1677* | (2019.01) |
| *G02F 1/1685* | (2019.01) |
| *H10K 59/12* | (2023.01) |
| *H10K 59/50* | (2023.01) |

(52) U.S. Cl.
CPC ........ *G02F 1/16757* (2019.01); *G02F 1/1677* (2019.01); *G02F 2001/1678* (2013.01); *G02F 2201/44* (2013.01); *G09G 2300/02* (2013.01); *G09G 2300/023* (2013.01); *G09G 2300/046* (2013.01); *G09G 2360/144* (2013.01); *H10K 59/12* (2023.02); *H10K 59/50* (2023.02)

(58) Field of Classification Search
CPC . G09G 2300/046; G02F 1/167; G02F 1/1685; G02F 2001/1678; G02F 1/16757; G02F 1/1677; G02F 2201/44; H10K 59/50; H10K 59/12
See application file for complete search history.

(56) References Cited

U.S. PATENT DOCUMENTS

| | | | |
|---|---|---|---|
| 5,930,026 | A | 7/1999 | Jacobson |
| 6,017,584 | A | 1/2000 | Albert et al. |
| 6,118,426 | A | 9/2000 | Albert et al. |
| 6,130,774 | A | 10/2000 | Albert et al. |
| 6,144,361 | A | 11/2000 | Gordon, II et al. |
| 6,172,798 | B1 | 1/2001 | Albert et al. |
| 6,184,856 | B1 | 2/2001 | Gordon, II et al. |
| 6,225,971 | B1 | 5/2001 | Gordon, II et al. |
| 6,241,921 | B1 | 6/2001 | Jacobson et al. |
| 6,271,823 | B1 | 8/2001 | Gordon, II et al. |
| 6,445,489 | B1 | 9/2002 | Jacobson et al. |
| 6,473,072 | B1 | 10/2002 | Comiskey et al. |
| 6,504,524 | B1 | 1/2003 | Gates et al. |
| 6,512,354 | B2 | 1/2003 | Jacobson et al. |
| 6,531,997 | B1 | 3/2003 | Gates et al. |
| 6,545,797 | B2 | 4/2003 | Chen et al. |
| 6,664,944 | B1 | 12/2003 | Albert et al. |
| 6,704,133 | B2 | 3/2004 | Gates et al. |
| 6,710,540 | B1 | 3/2004 | Albert et al. |
| 6,738,050 | B2 | 5/2004 | Comiskey et al. |
| 6,753,999 | B2 | 6/2004 | Zehner et al. |
| 6,788,452 | B2 | 9/2004 | Liang et al. |
| 6,825,829 | B1 | 11/2004 | Albert et al. |
| 6,825,970 | B2 | 11/2004 | Goenaga et al. |
| 6,864,875 | B2 | 3/2005 | Drzaic et al. |
| 6,900,851 | B2 | 5/2005 | Morrison et al. |
| 6,914,714 | B2 | 7/2005 | Chen et al. |
| 6,922,276 | B2 | 7/2005 | Zhang et al. |
| 6,972,893 | B2 | 12/2005 | Chen et al. |
| 6,982,178 | B2 | 1/2006 | LeCain et al. |
| 6,995,550 | B2 | 2/2006 | Jacobson et al. |
| 7,002,728 | B2 | 2/2006 | Pullen et al. |
| 7,012,600 | B2 | 3/2006 | Zehner et al. |
| 7,023,420 | B2 | 4/2006 | Comiskey et al. |
| 7,027,029 | B2 | 4/2006 | Yamaguchi et al. |
| 7,030,854 | B2 | 4/2006 | Baucom et al. |
| 7,034,783 | B2 | 4/2006 | Gates et al. |
| 7,038,656 | B2 | 5/2006 | Liang et al. |
| 7,038,670 | B2 | 5/2006 | Liang et al. |
| 7,046,228 | B2 | 5/2006 | Liang et al. |
| 7,052,571 | B2 | 5/2006 | Wang et al. |
| 7,061,166 | B2 | 6/2006 | Kuniyasu |
| 7,061,662 | B2 | 6/2006 | Chung et al. |
| 7,072,095 | B2 | 7/2006 | Liang et al. |
| 7,075,502 | B1 | 7/2006 | Drzaic et al. |
| 7,112,114 | B2 | 9/2006 | Liang et al. |
| 7,116,318 | B2 | 10/2006 | Amundson et al. |
| 7,116,466 | B2 | 10/2006 | Whitesides et al. |
| 7,119,759 | B2 | 10/2006 | Zehner et al. |
| 7,119,772 | B2 | 10/2006 | Amundson et al. |
| 7,144,942 | B2 | 12/2006 | Zang et al. |
| 7,158,282 | B2 | 1/2007 | Liang et al. |
| 7,167,155 | B1 | 1/2007 | Albert et al. |
| 7,170,506 | B2 | 1/2007 | Eldon et al. |
| 7,170,670 | B2 | 1/2007 | Webber |
| 7,177,066 | B2 | 2/2007 | Chung et al. |
| 7,193,625 | B2 | 3/2007 | Danner et al. |
| 7,202,847 | B2 | 4/2007 | Gates |
| 7,236,291 | B2 | 6/2007 | Kaga et al. |
| 7,236,292 | B2 | 6/2007 | LeCain |
| 7,242,514 | B2 | 7/2007 | Chung et al. |
| 7,259,730 | B2 | 8/2007 | O'Keeffe |
| 7,259,744 | B2 | 8/2007 | Arango et al. |
| 7,304,787 | B2 | 12/2007 | Whitesides et al. |
| 7,312,784 | B2 | 12/2007 | Baucom et al. |
| 7,312,794 | B2 | 12/2007 | Zehner et al. |
| 7,321,459 | B2 | 1/2008 | Masuda et al. |
| 7,327,511 | B2 | 2/2008 | Whitesides et al. |
| 7,339,715 | B2 | 3/2008 | Webber et al. |
| 7,385,751 | B2 | 6/2008 | Chen et al. |
| 7,408,699 | B2 | 8/2008 | Wang et al. |
| 7,411,719 | B2 | 8/2008 | Paolini, Jr. et al. |
| 7,443,571 | B2 | 10/2008 | LeCain et al. |
| 7,453,445 | B2 | 11/2008 | Amundson |
| 7,492,339 | B2 | 2/2009 | Amundson |
| 7,492,497 | B2 | 2/2009 | Paolini, Jr. et al. |
| 7,492,505 | B2 | 2/2009 | Liang et al. |
| 7,513,813 | B2 | 4/2009 | Paolini, Jr. et al. |
| 7,528,822 | B2 | 5/2009 | Amundson et al. |
| 7,535,624 | B2 | 5/2009 | Amundson et al. |
| 7,545,358 | B2 | 6/2009 | Gates et al. |
| 7,561,324 | B2 | 7/2009 | Duthaler et al. |
| 7,583,251 | B2 | 9/2009 | Arango et al. |
| 7,602,374 | B2 | 10/2009 | Zehner et al. |
| 7,612,760 | B2 | 11/2009 | Kawai |
| 7,636,191 | B2 | 12/2009 | Duthaler et al. |
| 7,649,666 | B2 | 1/2010 | Isobe et al. |
| 7,667,684 | B2 | 2/2010 | Jacobson et al. |
| 7,679,599 | B2 | 3/2010 | Kawai |
| 7,679,813 | B2 | 3/2010 | Liang et al. |
| 7,679,814 | B2 | 3/2010 | Paolini, Jr. et al. |
| 7,683,606 | B2 | 3/2010 | Kang et al. |
| 7,684,108 | B2 | 3/2010 | Wang et al. |
| 7,688,297 | B2 | 3/2010 | Zehner et al. |
| 7,705,824 | B2 | 4/2010 | Baucom et al. |
| 7,715,088 | B2 | 5/2010 | Liang et al. |
| 7,728,811 | B2 | 6/2010 | Albert et al. |
| 7,729,039 | B2 | 6/2010 | LeCain et al. |
| 7,733,311 | B2 | 6/2010 | Amundson et al. |
| 7,733,335 | B2 | 6/2010 | Zehner et al. |
| 7,787,169 | B2 | 8/2010 | Abramson et al. |
| 7,791,782 | B2 | 9/2010 | Paolini, Jr. et al. |
| 7,791,789 | B2 | 9/2010 | Albert et al. |
| 7,800,813 | B2 | 9/2010 | Wu et al. |
| 7,821,702 | B2 | 10/2010 | Liang et al. |
| 7,826,129 | B2 | 11/2010 | Wu et al. |
| 7,839,564 | B2 | 11/2010 | Whitesides et al. |
| 7,843,621 | B2 | 11/2010 | Danner et al. |
| 7,843,624 | B2 | 11/2010 | Danner et al. |
| 7,859,742 | B1 | 12/2010 | Chiu et al. |
| 7,910,175 | B2 | 3/2011 | Webber |
| 7,952,557 | B2 | 5/2011 | Amundson |
| 7,952,790 | B2 | 5/2011 | Honeyman et al. |
| 7,956,841 | B2 | 6/2011 | Albert et al. |
| 7,982,479 | B2 | 7/2011 | Wang et al. |
| 7,982,941 | B2 | 7/2011 | Lin et al. |
| 7,999,787 | B2 | 8/2011 | Amundson et al. |
| 8,009,348 | B2 | 8/2011 | Zehner et al. |
| 8,011,592 | B2 | 9/2011 | Wang |
| 8,034,209 | B2 | 10/2011 | Danner et al. |
| 8,040,594 | B2 | 10/2011 | Paolini, Jr. et al. |
| 8,054,526 | B2 | 11/2011 | Bouchard |
| 8,064,962 | B2 | 11/2011 | Wilcox et al. |
| 8,068,272 | B2 | 11/2011 | LeCain et al. |
| 8,077,141 | B2 | 12/2011 | Duthaler et al. |
| 8,077,381 | B2 | 12/2011 | LeCain et al. |
| 8,098,418 | B2 | 1/2012 | Paolini, Jr. et al. |
| 8,125,501 | B2 | 2/2012 | Amundson et al. |

(56) References Cited

U.S. PATENT DOCUMENTS

| | | |
|---|---|---|
| 8,139,050 B2 | 3/2012 | Jacobson et al. |
| 8,159,636 B2 | 4/2012 | Sun et al. |
| 8,162,212 B2 | 4/2012 | Chung et al. |
| 8,174,490 B2 | 5/2012 | Whitesides et al. |
| 8,177,942 B2 | 5/2012 | Paolini, Jr. et al. |
| 8,213,076 B2 | 7/2012 | Albert et al. |
| 8,243,013 B1 | 8/2012 | Sprague et al. |
| 8,274,472 B1 | 9/2012 | Wang et al. |
| 8,289,250 B2 | 10/2012 | Zehner et al. |
| 8,300,006 B2 | 10/2012 | Zhou et al. |
| 8,305,341 B2 | 11/2012 | Arango et al. |
| 8,314,784 B2 | 11/2012 | Ohkami et al. |
| 8,363,299 B2 | 1/2013 | Paolini, Jr. et al. |
| 8,373,649 B2 | 2/2013 | Low et al. |
| 8,384,658 B2 | 2/2013 | Albert et al. |
| 8,390,301 B2 | 3/2013 | Danner et al. |
| 8,422,116 B2 | 4/2013 | Sprague et al. |
| 8,441,714 B2 | 5/2013 | Paolini, Jr. et al. |
| 8,441,716 B2 | 5/2013 | Paolini, Jr. et al. |
| 8,456,414 B2 | 6/2013 | Lin et al. |
| 8,462,102 B2 | 6/2013 | Wong et al. |
| 8,466,852 B2 | 6/2013 | Drzaic et al. |
| 8,482,835 B2 | 7/2013 | LeCain |
| 8,503,063 B2 | 8/2013 | Sprague |
| 8,514,168 B2 | 8/2013 | Chung et al. |
| 8,537,105 B2 | 9/2013 | Chiu et al. |
| 8,553,012 B2 | 10/2013 | Baucom et al. |
| 8,558,783 B2 | 10/2013 | Wilcox et al. |
| 8,558,785 B2 | 10/2013 | Zehner et al. |
| 8,558,786 B2 | 10/2013 | Lin |
| 8,558,855 B2 | 10/2013 | Sprague et al. |
| 8,576,164 B2 | 11/2013 | Sprague et al. |
| 8,576,259 B2 | 11/2013 | Lin et al. |
| 8,576,470 B2 | 11/2013 | Paolini, Jr. et al. |
| 8,576,475 B2 | 11/2013 | Huang et al. |
| 8,593,396 B2 | 11/2013 | Amundson et al. |
| 8,593,721 B2 | 11/2013 | Albert et al. |
| 8,605,032 B2 | 12/2013 | Liu et al. |
| 8,605,354 B2 | 12/2013 | Zhang et al. |
| 8,643,595 B2 | 2/2014 | Chung et al. |
| 8,649,084 B2 | 2/2014 | Wang et al. |
| 8,665,206 B2 | 3/2014 | Lin et al. |
| 8,670,174 B2 | 3/2014 | Sprague et al. |
| 8,681,191 B2 | 3/2014 | Yang et al. |
| 8,704,756 B2 | 4/2014 | Lin |
| 8,717,664 B2 | 5/2014 | Wang et al. |
| 8,730,153 B2 | 5/2014 | Sprague et al. |
| 8,786,929 B2 | 7/2014 | LeCain et al. |
| 8,786,935 B2 | 7/2014 | Sprague |
| 8,797,634 B2 | 8/2014 | Paolini, Jr. et al. |
| 8,810,525 B2 | 8/2014 | Sprague |
| 8,810,899 B2 | 8/2014 | Sprague et al. |
| 8,830,553 B2 | 9/2014 | Patry et al. |
| 8,830,559 B2 | 9/2014 | Honeyman et al. |
| 8,854,721 B2 | 10/2014 | Danner et al. |
| 8,873,129 B2 | 10/2014 | Paolini, Jr. et al. |
| 8,902,153 B2 | 12/2014 | Bouchard et al. |
| 8,902,491 B2 | 12/2014 | Wang et al. |
| 8,917,439 B2 | 12/2014 | Wang et al. |
| 8,928,562 B2 | 1/2015 | Gates et al. |
| 8,928,641 B2 | 1/2015 | Chiu et al. |
| 8,964,282 B2 | 2/2015 | Wang et al. |
| 8,973,837 B2 | 3/2015 | Tsai et al. |
| 8,976,444 B2 | 3/2015 | Zhang et al. |
| 9,013,394 B2 | 4/2015 | Lin |
| 9,013,515 B2 | 4/2015 | Joseph et al. |
| 9,013,783 B2 | 4/2015 | Sprague |
| 9,019,197 B2 | 4/2015 | Lin |
| 9,019,198 B2 | 4/2015 | Lin et al. |
| 9,019,318 B2 | 4/2015 | Sprague et al. |
| 9,075,280 B2 | 7/2015 | Whitesides |
| 9,082,352 B2 | 7/2015 | Cheng et al. |
| 9,091,899 B2 | 7/2015 | Seong et al. |
| 9,116,412 B2 | 8/2015 | Lin |
| 9,128,244 B2 | 9/2015 | Coup et al. |
| 9,146,439 B2 | 9/2015 | Zhang |
| 9,164,207 B2 | 10/2015 | Honeyman et al. |
| 9,170,467 B2 | 10/2015 | Whitesides et al. |
| 9,170,468 B2 | 10/2015 | Lin et al. |
| 9,171,508 B2 | 10/2015 | Sprague et al. |
| 9,182,646 B2 | 11/2015 | Paolini, Jr. et al. |
| 9,188,829 B2 | 11/2015 | Li et al. |
| 9,195,111 B2 | 11/2015 | Anseth et al. |
| 9,197,704 B2 | 11/2015 | Sun et al. |
| 9,199,441 B2 | 12/2015 | Danner |
| 9,218,773 B2 | 12/2015 | Sun et al. |
| 9,224,338 B2 | 12/2015 | Chan et al. |
| 9,224,342 B2 | 12/2015 | Lin et al. |
| 9,224,344 B2 | 12/2015 | Chung et al. |
| 9,230,492 B2 | 1/2016 | Harrington et al. |
| 9,238,340 B2 | 1/2016 | Kayal et al. |
| 9,251,736 B2 | 2/2016 | Lin et al. |
| 9,262,973 B2 | 2/2016 | Wu et al. |
| 9,268,191 B2 | 2/2016 | Paolini, Jr. et al. |
| 9,269,311 B2 | 2/2016 | Amundson |
| 9,279,906 B2 | 3/2016 | Kang |
| 9,285,649 B2 | 3/2016 | Du et al. |
| 9,293,511 B2 | 3/2016 | Jacobson et al. |
| 9,299,294 B2 | 3/2016 | Lin et al. |
| 9,341,916 B2 | 5/2016 | Telfer et al. |
| 9,360,733 B2 | 6/2016 | Wang et al. |
| 9,361,836 B1 | 6/2016 | Telfer et al. |
| 9,373,289 B2 | 6/2016 | Sprague et al. |
| 9,383,623 B2 | 7/2016 | Lin et al. |
| 9,390,066 B2 | 7/2016 | Smith et al. |
| 9,390,661 B2 | 7/2016 | Chiu et al. |
| 9,412,314 B2 | 8/2016 | Amundson et al. |
| 9,423,666 B2 | 8/2016 | Wang et al. |
| 9,459,510 B2 | 10/2016 | Lin |
| 9,460,666 B2 | 10/2016 | Sprague et al. |
| 9,491,879 B2 | 11/2016 | Cheng et al. |
| 9,495,918 B2 | 11/2016 | Harrington et al. |
| 9,501,981 B2 | 11/2016 | Lin et al. |
| 9,513,527 B2 | 12/2016 | Chan et al. |
| 9,513,743 B2 | 12/2016 | Sjodin et al. |
| 9,541,814 B2 | 1/2017 | Lin et al. |
| 9,542,895 B2 | 1/2017 | Gates et al. |
| 9,554,495 B2 | 1/2017 | Danner et al. |
| 9,564,088 B2 | 2/2017 | Wilcox et al. |
| 9,612,502 B2 | 4/2017 | Danner et al. |
| 9,620,067 B2 | 4/2017 | Harrington et al. |
| 9,627,916 B2 | 4/2017 | Hsieh et al. |
| 9,671,668 B2 | 6/2017 | Chan et al. |
| 9,672,766 B2 | 6/2017 | Sjodin |
| 9,691,333 B2 | 6/2017 | Cheng et al. |
| 9,697,778 B2 | 7/2017 | Telfer et al. |
| 9,721,495 B2 | 8/2017 | Harrington et al. |
| 9,733,540 B2 | 8/2017 | LeCain et al. |
| 9,740,076 B2 | 8/2017 | Paolini, Jr. et al. |
| 9,759,980 B2 | 9/2017 | Du et al. |
| 9,786,233 B2 | 10/2017 | Hung |
| 9,792,861 B2 | 10/2017 | Chang et al. |
| 9,792,862 B2 | 10/2017 | Hung et al. |
| 9,812,073 B2 | 11/2017 | Lin et al. |
| 9,966,018 B2 | 5/2018 | Gates et al. |
| 10,067,398 B2 | 9/2018 | O'Keeffe |
| 10,162,242 B2 | 12/2018 | Wang et al. |
| 10,190,743 B2 | 1/2019 | Hertel et al. |
| 10,209,556 B2 | 2/2019 | Rosenfeld et al. |
| 10,229,641 B2 | 3/2019 | Yang et al. |
| 10,319,313 B2 | 6/2019 | Harris et al. |
| 10,339,876 B2 | 7/2019 | Lin et al. |
| 10,444,553 B2 | 10/2019 | Laxton |
| 10,514,583 B2 | 12/2019 | Zhang |
| 10,627,694 B1 | 4/2020 | Wang et al. |
| 10,672,350 B2 | 6/2020 | Amundson et al. |
| 10,983,410 B2 | 4/2021 | Widger et al. |
| 11,049,463 B2 | 6/2021 | Lin et al. |
| 11,314,098 B2 | 4/2022 | Zheng et al. |
| 11,397,366 B2 | 7/2022 | Lin et al. |
| 11,435,606 B2 | 9/2022 | Galwaduge et al. |
| 11,520,210 B2 | 12/2022 | O'Keeffe et al. |
| 11,579,510 B2 | 2/2023 | Ladavac et al. |
| 2002/0090980 A1 | 7/2002 | Wilcox et al. |

(56) References Cited

U.S. PATENT DOCUMENTS

| | | | |
|---|---|---|---|
| 2002/0185378 A1* | 12/2002 | Honeyman | C09B 68/4235 |
| | | | 204/601 |
| 2003/0102858 A1 | 6/2003 | Jacobson et al. | |
| 2004/0119681 A1 | 6/2004 | Albert et al. | |
| 2004/0246562 A1 | 12/2004 | Chung et al. | |
| 2005/0253777 A1 | 11/2005 | Zehner et al. | |
| 2007/0091418 A1 | 4/2007 | Danner et al. | |
| 2007/0103427 A1 | 5/2007 | Zhou et al. | |
| 2007/0176912 A1 | 8/2007 | Beames et al. | |
| 2007/0237962 A1 | 10/2007 | Liang et al. | |
| 2007/0285385 A1 | 12/2007 | Albert et al. | |
| 2008/0024429 A1 | 1/2008 | Zehner | |
| 2008/0024482 A1 | 1/2008 | Gates et al. | |
| 2008/0043318 A1 | 2/2008 | Whitesides et al. | |
| 2008/0048970 A1 | 2/2008 | Drzaic et al. | |
| 2008/0136774 A1 | 6/2008 | Harris et al. | |
| 2008/0303780 A1 | 12/2008 | Sprague et al. | |
| 2009/0168067 A1 | 7/2009 | LeCain et al. | |
| 2009/0174651 A1 | 7/2009 | Jacobson et al. | |
| 2009/0225398 A1 | 9/2009 | Duthaler et al. | |
| 2009/0322721 A1 | 12/2009 | Zehner et al. | |
| 2010/0156780 A1 | 6/2010 | Jacobson et al. | |
| 2010/0194733 A1 | 8/2010 | Lin et al. | |
| 2010/0194789 A1 | 8/2010 | Lin et al. | |
| 2010/0220121 A1 | 9/2010 | Zehner et al. | |
| 2010/0265561 A1 | 10/2010 | Gates et al. | |
| 2011/0043543 A1 | 2/2011 | Chen et al. | |
| 2011/0063314 A1 | 3/2011 | Chiu et al. | |
| 2011/0164301 A1 | 7/2011 | Paolini, Jr. et al. | |
| 2011/0193840 A1 | 8/2011 | Amundson et al. | |
| 2011/0193841 A1 | 8/2011 | Amundson et al. | |
| 2011/0199671 A1 | 8/2011 | Amundson et al. | |
| 2011/0221740 A1 | 9/2011 | Yang et al. | |
| 2012/0001957 A1 | 1/2012 | Liu et al. | |
| 2012/0098740 A1 | 4/2012 | Chiu et al. | |
| 2012/0326957 A1 | 12/2012 | Drzaic et al. | |
| 2013/0063333 A1 | 3/2013 | Arango et al. | |
| 2013/0141778 A1* | 6/2013 | Paolini, Jr. | G02F 1/1677 |
| | | | 359/296 |
| 2013/0176288 A1 | 7/2013 | Hung et al. | |
| 2013/0221112 A1 | 8/2013 | Lai et al. | |
| 2013/0242378 A1 | 9/2013 | Paolini, Jr. et al. | |
| 2013/0249782 A1 | 9/2013 | Wu et al. | |
| 2013/0278995 A1 | 10/2013 | Drzaic et al. | |
| 2014/0009817 A1 | 1/2014 | Wilcox et al. | |
| 2014/0049808 A1 | 2/2014 | Yang | |
| 2014/0055840 A1 | 2/2014 | Zang et al. | |
| 2014/0078576 A1 | 3/2014 | Sprague | |
| 2014/0204012 A1 | 7/2014 | Wu et al. | |
| 2014/0206292 A1 | 7/2014 | Hung et al. | |
| 2014/0240210 A1 | 8/2014 | Wu et al. | |
| 2014/0253425 A1 | 9/2014 | Zalesky et al. | |
| 2014/0293398 A1 | 10/2014 | Wang et al. | |
| 2014/0362213 A1 | 12/2014 | Tseng | |
| 2015/0005720 A1 | 1/2015 | Zang | |
| 2015/0118390 A1 | 4/2015 | Rosenfeld et al. | |
| 2015/0262255 A1 | 9/2015 | Khajehnouri et al. | |
| 2015/0262551 A1 | 9/2015 | Zehner et al. | |
| 2015/0268531 A1 | 9/2015 | Wang et al. | |
| 2015/0301246 A1 | 10/2015 | Zang et al. | |
| 2016/0012710 A1 | 1/2016 | Lu et al. | |
| 2016/0048054 A1 | 2/2016 | Danner | |
| 2016/0140910 A1 | 5/2016 | Amundson | |
| 2016/0180777 A1 | 6/2016 | Lin et al. | |
| 2017/0287377 A1* | 10/2017 | Telfer | G09G 3/344 |
| 2017/0310956 A1* | 10/2017 | Perdices-Gonzalez | |
| | | | G09G 3/2092 |
| 2018/0059499 A1* | 3/2018 | Klement | H10K 59/50 |
| 2018/0364542 A1* | 12/2018 | Widger | G02F 1/167 |
| 2020/0294468 A1* | 9/2020 | Hung | G09G 5/10 |
| 2022/0291432 A1 | 9/2022 | O'Keeffe | |
| 2023/0080781 A1 | 3/2023 | Zheng et al. | |

OTHER PUBLICATIONS

Yamaguchi, Y. et al., "Toner display using insulative particles charged triboelectrically", Asia Display/IDW '01, pp. 1729-1730, Paper AMD4-4 (2001).
Penczek, John et al., "Developing E-paper Standards for the Mobile Age", SID Digest, vol. 45, pp. 865-868 (2014).
Hertel, Dirk et al., "Viewing Direction Measurements with Hemispherical Diffuse Illumination on E-Paper Displays", SID Digest, vol. 45, pp. 532-535 (2014).

* cited by examiner

HYBRID EMISSIVE/TRANSMISSIVE DISPLAYS AND COMBINATION DISPLAYS INCLUDING E PAPER AND HYBRID EMISSIVE/TRANSMISSIVE DISPLAYS

RELATED APPLICATIONS

This application claims priority to U.S. Provisional Patent Application No. 63/541,513, filed Sep. 29, 2023. All patents and publications described herein are incorporated by reference in their entireties.

BACKGROUND

Digital out-of-home displays (DOOH) can be found everywhere, including billboards, menu boards, hospitals, grocery stores, bus kiosks, libraries, and schools. Because of the low price of the (typically) LCD displays, a DOOH information display can be changed dynamically, however there are many restrictions on the distractions caused by such DOOH displays so many of the displays are providing approximately the same content for long periods of time. Nonetheless, larger format DOOH signage has decreased significantly in installation cost and marketing studies show that consumers are more likely to take notice of a moving image than a static image. Regrettably, large format LCDs consume a tremendous amount of energy, especially when used outdoors during the day. Some countries have even taken to limiting their use during daylight hours in an effort to conserve energy.

Emissive displays, such as liquid crystal displays, have a characteristic look due to the nature of the light being emitted from such displays. Reflective displays, such as electrophoretic image displays, provide a much different appearance owing to the differences between reflected light and emitted light. Each of the devices has benefits and disadvantages. For example, emissive displays (LCD, LED, OLED) can play real-time video, and are generally inexpensive to produce, however they are very energy-intensive. For example, many 65" LCD displays consume over 200 W of power when in use, which may include simply displaying the same static information. Additionally, many people find the glare from LCDs to be distracting especially when the displays are showing moving images in the background, such as a billboard or other commercial signage. Electrophoretic displays, on the other hand are visually appealing because of their paper-like qualities whereby they reflect ambient light or incorporate a subtle front light. In contrast to LCDs, LEDs, and OLEDs, electrophoretic displays are also able to display the same image (such as a train table) for days without any power consumption. Nonetheless, electrophoretic displays (on average) are more expensive for a given display diagonal (e.g., 23", 44", 65", etc.) and they typically cannot display video-rate images.

A need exists for improved display systems that provide video-speed performance to increase consumer interaction, but with less energy cost. It would also be beneficial if such display systems were subtle and relied to a greater degree on reflected light so that they appear more paper-like.

SUMMARY

The invention provides an improved display system that combines properties of emissive and reflective displays to provide a 'paper-like' appearance to an image display. These improved display systems overcome many of the shortcomings of existing systems by utilizing emitted light from an emissive display in combination with modulation via filtering, absorption, and/or scattering of light with a variable transmission layer, such as an electro-optic or electrophoretic display. In some embodiments, the display system utilizes an ambient light sensor to determine the quantity and quality of ambient light, which is then used by a controller to manipulate the display system to provide a desired image at a given location.

In accordance with one aspect of the invention a hybrid display device is disclosed comprising an emissive display, a variable transmission electrophoretic display, and a controller. The emissive display has at least one emission surface from which an image is displayed to be viewable from a viewing location. The variable transmission electrophoretic display is positioned between the emissive display and the viewing location to at least partially alter the image at the viewing location, whereby the variable transmission electrophoretic display comprising an internal phase comprising a plurality of charged white particles disposed in a fluid. The controller is operably coupled to the variable transmission electrophoretic display, the controller configured to adjust a state of the variable transmission electrophoretic display to generate a desired altered image to be viewable from the viewing location. In one embodiment, an optically-clear adhesive layer is disposed between the emissive display and the variable transmission electrophoretic display. In one embodiment, the hybrid display device further comprises an ambient light sensor. In one embodiment, the controller is operably coupled to the ambient light sensor. In one embodiment, the controller is configured to receive a signal from the ambient light sensor and, in response to receiving the signal, adjust the transmission of the variable transmission electrophoretic display. In one embodiment, the ambient light sensor measures an intensity of ambient light and a spectrum of ambient light. In one embodiment, the variable transmission electrophoretic display is configured to operate in a shutter mode that includes a closed state and an open state, wherein the closed state provides at least 40% transmission and at most 40% visual light reflection and/or visual light scatter, wherein the open state provides at least 60% visual light transmission and at most 30% visual light reflection and/or visual light scatter. In one embodiment, the charged white particles comprise titania. In one embodiment, the internal phase is encapsulated in gelatin microcapsules. In one embodiment, the internal phase is encapsulated in microstructures and scaled with a scaling layer.

In accordance with another aspect of the invention a combination display is disclosed, including a substrate, a hybrid display, and an e paper display. The hybrid display device is coupled to the substrate, and includes an emissive display having at least one emission surface from which an image is displayed to be viewable from a viewing location, a variable transmission electrophoretic display positioned between the emissive display and the viewing location to at least partially alter the image at the viewing location, the variable transmission electrophoretic display comprising an internal phase comprising a plurality of charged particles disposed in a fluid, and a controller operably coupled to the variable transmission electrophoretic display, the controller configured to adjust a state of the variable transmission electrophoretic display to generate a desired altered image to be viewable from the viewing location. The e paper display is also coupled to the substrate, and located adjacent the hybrid display, the e paper display includes a front light-transmissive electrode, a backplane electrode, an electrophoretic medium disposed between the front light-transmissive electrode and the backplane electrode, and an image controller operably coupled to the e paper display, the image controller configured to send electrical signals to the e paper display to cause the e paper display to change displayed images. In one embodiment, the hybrid display device further comprising an ambient light sensor. In one embodiment, the controller is operably coupled to the ambient light sensor. In one embodiment, the controller is configured to receive a signal from the ambient light sensor and, in response to receiving the signal, adjust the transmission of the variable transmission electrophoretic display. In one embodiment, the combination display includes a protective sheet covering the hybrid display device and the e paper display In one embodiment, the charged particles are white. In one embodiment, the charged particles are black. In one embodiment, the electrophoretic medium comprises at least four different sets of charged pigment particles wherein each set of charged pigment particles has a different color.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

In FIG. 1A, the emissive display and the variable transmission medium are in direct contact with one another.

In FIG. 1B, the emissive display and the variable transmission medium are not in direct contact with one another.

In FIG. 2A, the emissive display and the electrophoretic image display are in direct contact with one another, however they may include an intervening optically clear adhesive (OCA).

In FIG. 2B, the emissive display and the electrophoretic image display are not in direct contact with one another, however they may include an intervening optically clear adhesive (OCA).

In FIG. 2A, the emissive display and the electrophoretic image display are in direct contact with one another, however they may include an intervening optically clear adhesive (OCA).

In FIG. 2B, the emissive display and the electrophoretic image display are not in direct contact with one another, however they may include an intervening optically clear adhesive (OCA).

DETAILED DESCRIPTION

Figures 1A, 1B:
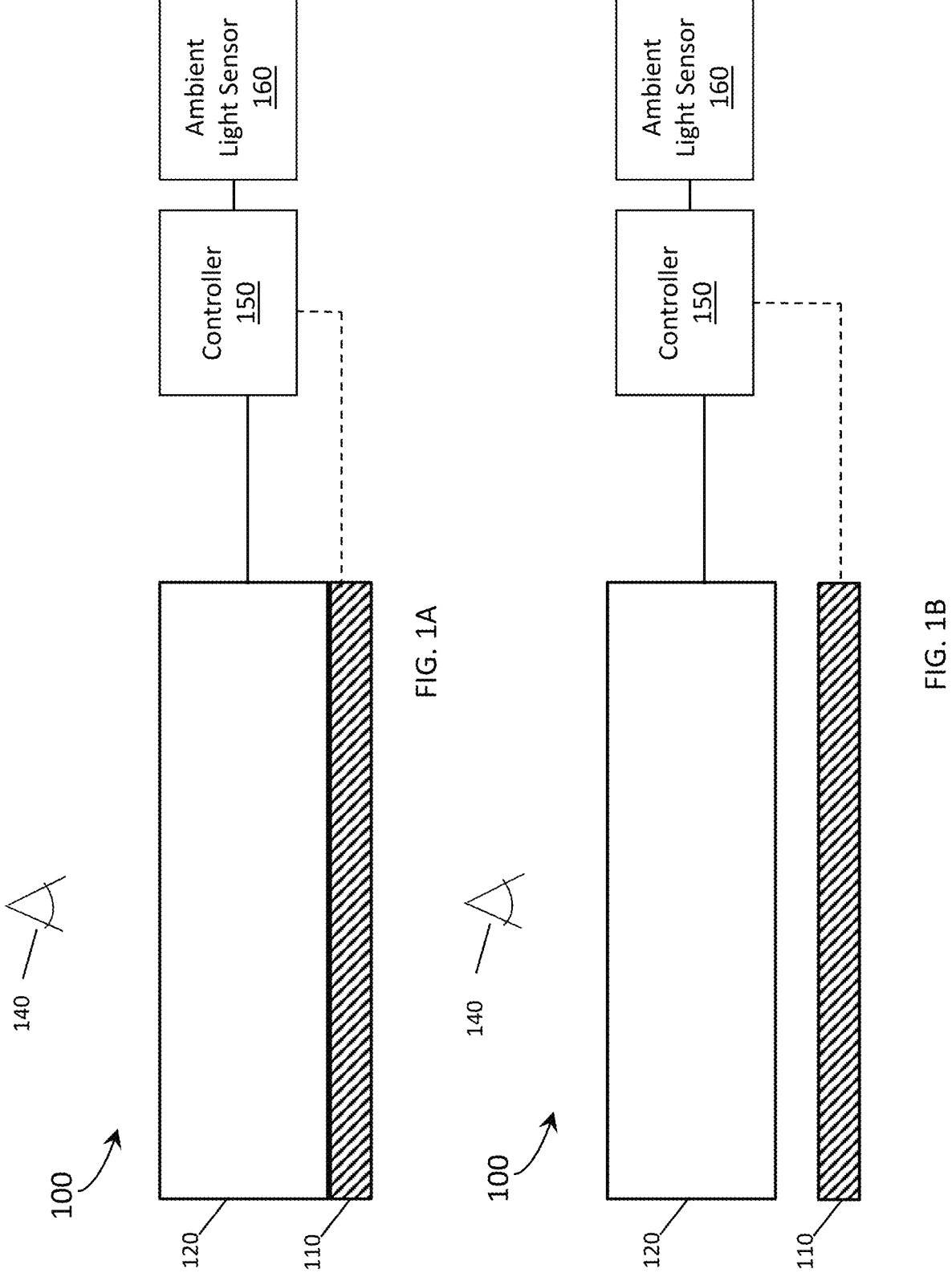
FIG. 1A illustrates a display system of the invention.
FIG. 1B illustrates a display system of the invention.

The present disclosure relates to processes and components for forming hybrid displays including both LCD/LED/OLED displays and electrophoretic displays. Typically, the electrophoretic display is of a variable transmission type, however other variable transmission media (such as electrochromic) could be substituted for the electrophoretic display.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence, or, in the case of displays intended for machine reading, pseudo-color in the sense of a change in reflectance of electromagnetic wavelengths outside the visible range.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

"Shutter mode" electrophoretic displays are configured so that the particles can switch between a largely light-blocking (or reflecting) state and a largely light-transmitting state. These displays often are constructed with particles which can migrate between a smaller and larger electrode. Migration of the particles to the large electrodes allows them to spread out, causing the capsule to take on the visual properties of the particles. Migration of the particles to the smaller electrode causes the capsule to take on the visual properties of the dispersing fluid or of the larger electrode, because the particles are "clumped" together near the smaller electrode. Another use of this effect is to control transmission of light through the capsule. The drawback to shutter mode displays is that the electrodes must be etched very precisely.

Numerous patents and applications assigned to or in the names of the Massachusetts Institute of Technology (MIT), E Ink Corporation, E Ink California, LLC and related companies describe various technologies used in encapsulated and microcell electrophoretic and other electro-optic media. Encapsulated electrophoretic media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. In a microcell electrophoretic display, the charged particles and the fluid are not encapsulated within microcapsules but instead are retained within a plurality of cavities formed within a carrier medium, typically a polymeric film. The technologies described in these patents and applications include:

(a) Electrophoretic particles, fluids and fluid additives; see for example U.S. Pat. Nos. 7,002,728; 7,679,814;

(b) Capsules, binders and encapsulation processes; see for example U.S. Pat. Nos. 6,922,276; 7,411,719;

(c) Microcell structures, wall materials, and methods of forming microcells; see for example U.S. Pat. Nos. 7,072,095; and 9,279,906;

(d) Methods for filling and sealing microcells; see for example U.S. Pat. Nos. 7,144,942; and 7,715,088;

(c) Films and sub-assemblies containing electro-optic materials; see for example U.S. Pat. Nos. 6,825,829; 6,982,178; 7,112,114; 7,158,282; 7,236,292; 7,443,571; 7,513,813; 7,561,324; 7,636,191; 7,649,666; 7,728,811; 7,729,039; 7,791,782; 7,839,564; 7,843,621; 7,843,624; 8,034,209; 8,068,272; 8,077,381; 8,177,942; 8,390,301; 8,482,835; 8,786,929; 8,830,553; 8,854,721; 9,075,280; and 9,238,340; and U.S. Patent Applications Publication Nos. 2007/0237962; 2009/0109519; 2009/0168067; 2011/0164301; 2014/0115884; and 2014/0340738;

(f) Backplanes, adhesive layers and other auxiliary layers and methods used in displays; see for example U.S. Pat. Nos. 7,116,318; 7,535,624;

(g) Color formation and color adjustment; see for example U.S. Pat. Nos. 6,017,584; 6,545,797; 6,664,944; 6,788,452; 6,864,875; 6,914,714; 6,972,893; 7,038,656; 7,038,670; 7,046,228; 7,052,571; 7,075,502; 7,167,155; 7,385,751; 7,492,505; 7,667,684; 7,684,108; 7,791,789; 7,800,813; 7,821,702; 7,839,564; 7,910,175; 7,952,790; 7,956,841; 7,982,941; 8,040,594; 8,054,526; 8,098,418; 8,159,636; 8,213,076; 8,363,299; 8,422,116; 8,441,714; 8,441,716; 8,466,852; 8,503,063; 8,576,470; 8,576,475; 8,593,721; 8,605,354; 8,649,084; 8,670,174; 8,704,756; 8,717,664; 8,786,935; 8,797,634; 8,810,899; 8,830,559; 8,873,129; 8,902,153; 8,902,491; 8,917,439; 8,964,282; 9,013,783; 9,116,412; 9,146,439; 9,164,207; 9,170,467; 9,170,468; 9,182,646; 9,195,111; 9,199,441; 9,268,191; 9,285,649; 9,293,511; 9,341,916; 9,360,733; 9,361,836; 9,383,623; and 9,423,666; and U.S. Patent Applications Publication Nos. 2008/0043318; 2008/0048970; 2009/0225398; 2010/0156780; 2011/0043543; 2012/0326957; 2013/0242378; 2013/0278995; 2014/0055840; 2014/0078576; 2014/0340430; 2014/0340736; 2014/0362213; 2015/0103394; 2015/0118390; 2015/0124345; 2015/0198858; 2015/0234250; 2015/0268531; 2015/0301246; 2016/0011484; 2016/0026062; 2016/0048054; 2016/0116816; 2016/0116818; and 2016/0140909;

(h) Methods for driving displays; see for example U.S. Pat. Nos. 5,930,026; 6,445,489; 6,504,524; 6,512,354; 6,531,997; 6,753,999; 6,825,970; 6,900,851; 6,995,550; 7,012,600; 7,023,420; 7,034,783; 7,061,166; 7,061,662; 7,116,466; 7,119,772; 7,177,066; 7,193,625; 7,202,847; 7,242,514; 7,259,744; 7,304,787; 7,312,794; 7,327,511; 7,408,699; 7,453,445; 7,492,339; 7,528,822; 7,545,358; 7,583,251; 7,602,374; 7,612,760; 7,679,599; 7,679,813; 7,683,606; 7,688,297; 7,729,039; 7,733,311; 7,733,335; 7,787,169;

7,859,742; 7,952,557; 7,956,841; 7,982,479; 7,999,787; 8,077,141; 8,125,501; 8,139,050; 8,174,490; 8,243,013; 8,274,472; 8,289,250; 8,300,006; 8,305,341; 8,314,784; 8,373,649; 8,384,658; 8,456,414; 8,462, 102; 8,514, 168; 8,537,105; 8,558,783; 8,558,785; 8,558,786; 8,558,855; 8,576,164; 8,576,259; 8,593,396; 8,605,032; 8,643,595; 8,665,206; 8,681,191; 8,730,153; 8,810,525; 8,928,562; 8,928,641; 8,976,444; 9,013,394; 9,019,197; 9,019,198; 9,019,318; 9,082,352; 9,171,508; 9,218,773; 9,224,338; 9,224,342; 9,224,344; 9,230,492; 9,251,736; 9,262,973; 9,269,311; 9,299,294; 9,373,289; 9,390,066; 9,390,661; and 9,412,314; and U.S. Patent Applications Publication Nos. 2003/0102858; 2004/0246562; 2005/0253777; 2007/0091418; 2007/0103427; 2007/0176912; 2008/0024429; 2008/0024482; 2008/0136774; 2008/0291129; 2008/0303780; 2009/0174651; 2009/0195568; 2009/0322721; 2010/0194733; 2010/0194789; 2010/0220121; 2010/0265561; 2010/0283804; 2011/0063314; 2011/0175875; 2011/0193840; 2011/0193841; 2011/0199671; 2011/0221740; 2012/0001957; 2012/0098740; 2013/0063333; 2013/0194250; 2013/0249782; 2013/0321278; 2014/0009817; 2014/0085355; 2014/0204012; 2014/0218277; 2014/0240210; 2014/0240373; 2014/0253425; 2014/0292830; 2014/0293398; 2014/0333685; 2014/0340734; 2015/0070744; 2015/0097877; 2015/0109283; 2015/0213749; 2015/0213765; 2015/0221257; 2015/0262255; 2015/0262551; 2016/0071465; 2016/0078820; 2016/0093253; 2016/0140910; and 2016/0180777;

(i) Applications of displays; see for example U.S. Pat. Nos. 6,118,426; 6,473,072; 6,704,133; 6,710,540; 6,738,050; 6,825,829; 7,030,854; 7,119,759; 7,312,784; 7,705,824; 8,009,348; 8,011,592; 8,064,962; 8,162,212; 8,553,012; 8,973,837; 9,188,829; and 9,197,704; and U.S. Patent Applications Publication Nos. 2002/0090980; 2004/0119681; 2007/0285385; 2013/0176288; 2013/0221112; 2013/0233930; 2013/0235536; 2014/0049808; 2014/0062391; 2014/0206292; and 2016/0035291; and International Application Publication No. WO 00/36560; and (j) Non-electrophoretic displays, as described in U.S. Pat. No. 6,241,921; and U.S. Patent Application Publication No. 2015/0277160; and applications of encapsulation and microcell technology other than displays; see for example U.S. Patent Application Publications Nos. 2015/0005720 and 2016/0012710.

An encapsulated or microcell electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet print- ing processes; electrophoretic deposition; and other similar techniques.) Thus, the resulting display can be flexible.

Further, because the display medium can be printed (using a variety of methods), the display itself can be made inexpensively.

The preferred process for preparing electrophoretic capsules described in the aforementioned E Ink and MIT patents and applications uses a gelatin/acacia coacervate as the encapsulation material, and the process for forming such gelatin/acacia capsules may be summarized as follows; see, for example, the aforementioned 2002/0180687, Paragraphs [0069] to [0074]. An alternative construction for forming an electrophoretic medium is to capture the internal phase material in microcells that are sealed with a scaling layer. The details for the process of forming the microcells, filling the microcells with internal phase material, scaling the microcells, and incorporating the sealed microcells into a display are discussed in greater detail in the US Patents and Applications listed above. An internal phase may include one or more types of electrophoretic particles in a suspend- ing fluid; typically, the internal phase comprises titania and carbon black particles in an uncolored hydrocarbon suspend- ing fluid. However, for variable transmission applications, the internal phase may comprise only a single type of charged particle, e.g., functionalized carbon black or titania. Alternatively, the internal phase may include more than two types of particles, such as three, four, or more. The particles may be colored, i.e., not black and not white.

Although electrophoretic media are often opaque (since, for example, in many electrophoretic media, the particles substantially block transmission of visible light through the display) and operate in a reflective mode, many electropho- retic displays can be made to operate in a so-called "shutter mode" in which one display state is substantially opaque and one is light-transmissive. Sec, for example, the aforemen- tioned U.S. Pat. Nos. 6,130,774; 6,172,798, 5,872,552; 6,144,361; 6,271,823; 6,225,971; and 6,184,856. Dielectro- phoretic displays, which are similar to electrophoretic dis- plays but rely upon variations in electric field strength, can operate in a similar mode; see U.S. Pat. No. 4,418,346. In some cases, the shutter mode can provide one display state that is substantially light-transmissive and one that is sub- stantially translucent and/or scattering of transmitted light and/or diffusing of transmitted light.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coat- ing; spin coating; brush coating; air knife coating; silk screen printing processes; electrostatic printing processes; thermal printing processes; ink jet printing processes; elec- trophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic materials may also be used in the present invention. Of particular interest, bistable ferro- electric liquid crystal displays (FLC's) are known in the art.

Other types of electro-optic media may also be used in the displays of the present invention.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

An electro-optic display normally comprises a layer of electro-optic material and at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic layer.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 μm), preferably about 2 to about 10 mil (51 to 254 μm). The electrically-conductive layer is conveniently a thin metal or metal oxide layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington DE, and such commercial materials may be used with good results in the front plane laminate.

U.S. Pat. No. 7,839,564 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin layer of adhesive may or may not be present between the electro-optic layer and a backplane. Such electro-optic displays can combine good resolution with good low temperature performance.

Light modulators represent a potentially important market for electro-optic media. As the energy performance of buildings and vehicles becomes increasingly important, electro-optic media can be used as coatings on windows (including skylights and sunroofs) to enable the proportion of incident radiation transmitted through the windows to be electronically controlled by varying the optical state of the electro-optic media. Effective implementation of such "variable-transmissivity" ("VT") technology in buildings is expected to provide (1) reduction of unwanted heating effects during hot weather, thus reducing the amount of energy needed for cooling, the size of air conditioning plants, and peak electricity demand; (2) increased use of natural daylight, thus reducing energy used for lighting and peak electricity demand; and (3) increased occupant comfort by increasing both thermal and visual comfort. Even greater benefits would be expected to accrue in an automobile, where the ratio of glazed surface to enclosed volume is significantly larger than in a typical building. Specifically, effective implementation of VT technology in automobiles is expected to provide not only the aforementioned benefits but also (1) increased motoring safety, (2) reduced glare, (3) enhanced mirror performance (by using an electro-optic coating on the mirror), and (4) increased ability to use heads-up displays. Other potential applications of VT technology include privacy glass and glare-guards in electronic devices.

U.S. Pat. No. 7,327,511 describes various factors which are important in adapting electrophoretic media for optimum performance in light modulators. One important factor is minimization of haze. In this application, "haze" refers to the percentage of diffuse transmitted light (light that is scattered as it is transmitted), compared to total transmitted light. In order to create a variable transmission film (VTF) with reduced haze it is important to match the refractive index of all components present at non-planar interfaces. In capsule-based electrophoretic media such non-planar interfaces exist at the boundaries between the internal phase (the electrophoretic particles and the surrounding fluid) and the capsule walls, and at the boundaries between the capsules walls and the binder which, as described in the aforementioned E Ink and MIT patents and applications, normally surrounds the capsules and forms them into a coherent layer. In polymer-dispersed and some microcell electrophoretic media, such curved surfaces exist at the boundaries between the internal phase and the surrounding continuous phase or binder.

An exemplary display device is illustrated in FIG. 1A and FIG. 1B. Display device 100 comprises an emissive display 110 and a variable transmission medium 120. The variable transmission medium 120 is typically facing the viewing location 140 from which the display device 100 is intended to be viewed. Display device 100 includes a controller 150 and an ambient light sensor 160. FIG. 1A illustrates the case where the emissive display 110 and the variable transmission medium 120 are in direct contact with one another. FIG. 1B illustrates the case where the emissive display 110 and the variable transmission medium 120 are not in direct contact with one another. FIG. 1A and FIG. 1B illustrate the ambient light sensor 160 as a required element, but it is expressly contemplated here that the ambient light sensor can be optional in certain cases. As discussed below, the emissive display 110 can be a (back-lit) LCD display, an LED display, an OLED display, etc. The emissive display 110 includes image pixels of the type that allow a variety of images to be dynamically presented (as opposed to a segmented electrode backplane). The variable transmission medium 120 typically includes an entirely separate display whose light transmission is controlled electronically. Theoretically, the variable transmission medium 120 can include any electrically-actuable transmission material, such as electrochromic, suspended particle (SPD), or electrophoretic materials.

Figures 2A, 2B:
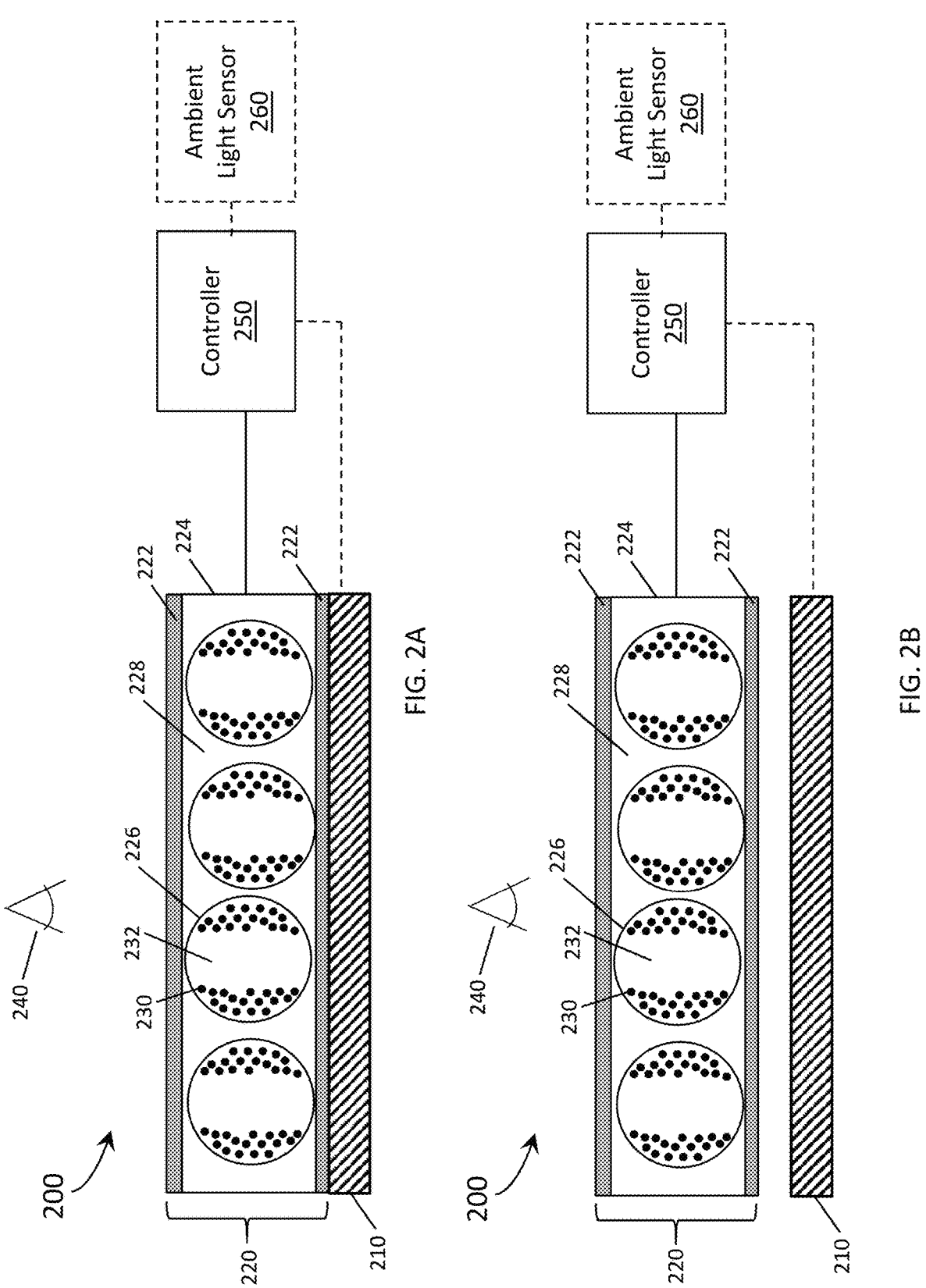
FIG. 2A illustrates an embodiment of a display system of the invention.
FIG. 2B illustrates an embodiment of a display system of the invention.

A more specific exemplary display device (including encapsulated electrophoretic media) is illustrated in FIG. 2A and FIG. 2B, where the variable transmission medium is an electrophoretic image display ("EPID") 220. In this aspect, display device 200 normally comprises an emissive display 210 and an EPID 220. The EPID 220 is typically facing the viewing location 240 from which the display device 200 is intended to be viewed. Display device 200 includes a controller 250. Display device 200 optionally includes an ambient light sensor 260. FIG. 2A illustrates the case where the emissive display 210 and the EPID 220 are in direct contact with one another. FIG. 2B illustrates the case where the emissive display 210 and the EPID 220 are not in direct contact with one another.

The EPID 220 typically includes electrodes 222 and an electrophoretic layer 224 including a plurality of encapsulated droplets of an internal phase 226 in a binder 228. The electrodes 222 are light-transmissive, and are typically fabricated from sheets of PET-ITO (Saint Gobain). The encapsulated droplets of the internal phase 226 typically include a plurality of particles 230 disposed in a fluid 232. The particles 230 are capable of moving through the fluid 232 upon application of an electric field. The particles 230 may be light absorbing (black), light scattering (white) or some other color as desired for the application. The particles 230 often comprise carbon black (black) or titania (white).

The EPID 220 can have other electrode 222 configurations besides those illustrated, including but not limited to, electrode 222 configurations discussed in the references above and other electrode configurations understood by those having ordinary skill in the electrophoretic display arts to be useful for the functions described herein.

The EPID 220 can optionally include various substrates, adhesive layers, protection layers, and other components that provide structural aspects of the EPID 220 without significantly impacting performance.

The electrodes 222 can be substantially transparent. In some cases, the electrodes 222 are composed of indium tin oxide disposed on a light-transparent substrate. Alternative light-transmissive electrode materials, such as PEDOT, graphene, metal whiskers, or nanotubes are also suitable.

The binder 228 is typically a polyurethane, though other binders are contemplated, including those identified in the references discussed above and other binders understood by those having ordinary skill in the electrophoretic display arts to be suitable for use in this context. Often the binder 228 is index matched to the PET substrate of the electrode layer 222. The binder 228 may also be tinted to shift the color spectrum of the light transmitted though the EPID 220. The microcapsule walls 226 can be a collagen-acacia coacervate. In some instances the microcapsule walls 226 will also include fish gelatin, i.e., as described in U.S. Pat. No. 10,983,410.

The particles 230 are typically white particles, though other color particles are contemplated, including black particles, primary color particles, secondary color particles, and other combinations of colored particles. The particles 230 can all have the same color or can have different colors. In some cases, the particles can be metal oxide particles. The particles 230 can be titanium dioxide.

The EPID 220 can operate in shutter mode. The shutter mode can include at least two states, typically a closed state and an open state. In the "open" state, the particles are forced to the edges of the capsules, i.e., as shown in FIGS. 2A and 2B. In the "closed" state, the particles are distributed relatively evenly throughout the capsules (not shown in FIGS. 2A and 2B). In certain cases, the EPID 220 in the closed state provides at least 40% visual light transmission and at most 40% visual light reflection and/or visual light scatter. In certain cases, the EPID 220 in the open state provides at least 60% visual light transmission and at most 30% visual light reflect and/or visual light scatter. These transmission and reflection/scatter values can be varied to achieve different effects.

Figures 3A, 3B:
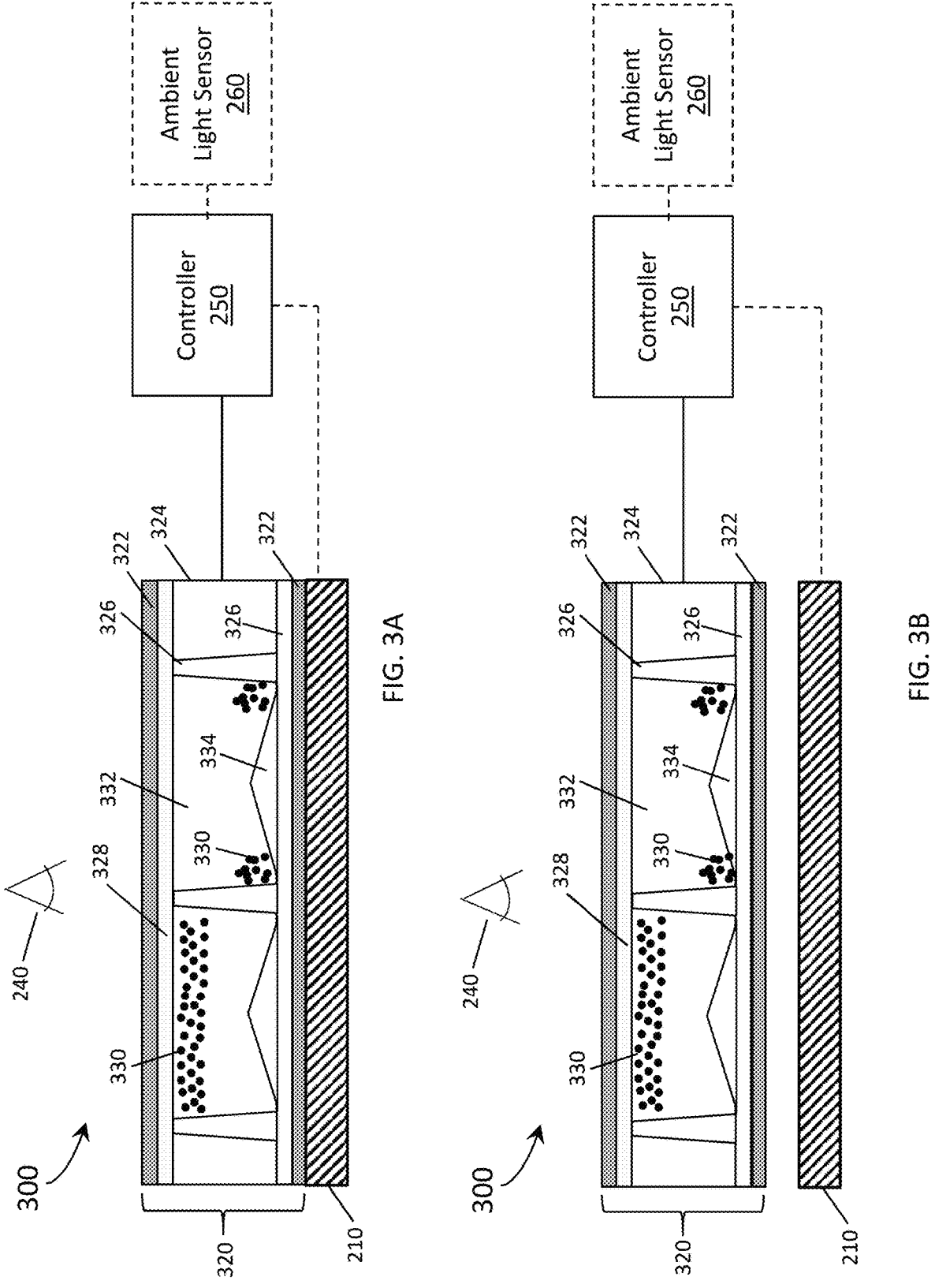
FIG. 3A illustrates an embodiment of a display system of the invention.
FIG. 3B illustrates an embodiment of a display system of the invention.

An alternate construction including molded microcontainers (a.k.a. microcells, a.k.a. microcups) is illustrated in FIG. 3A and FIG. 3B, where the variable transmission medium is an electrophoretic image display ("EPID") 320. In this aspect, display device 300 normally comprises an emissive display 210 and an EPID 320. The EPID 320 is typically facing the viewing location 240 from which the display device 300 is intended to be viewed. Display device 300 includes a controller 250. Display device 300 optionally includes an ambient light sensor 260. FIG. 3A illustrates the case where the emissive display 210 and the EPID 320 are in direct contact with one another. FIG. 3B illustrates the case where the emissive display 210 and the EPID 220 are not in direct contact with one another. Again, a layer of optically-clear adhesive (not shown) may be disposed between the emissive display 210 and the EPID 320.

The EPID 320 typically includes electrodes 322 and an electrophoretic layer 324 including an internal phase 232 disposed in an embossed microstructure 326 and sealed with a light-transmissive sealing layer 328. The internal phase 232 typically include a plurality of particles 330 disposed in a fluid. The particles 330 are capable of moving through the fluid upon application of an electric field between the electrodes 322. In the "closed state" the particles 330 are distributed between the electrodes 322 to absorb at least a portion of the transmitted light, i.e., the light moving between the electrodes 332, for example light emitted from the emissive display 210. In the "open" state the particles 330 are collected together to maximize light transmission. In some embodiments the embossed microstructure 326 may include light-transmissive features 334 that facilitate movement of the particles 330 between the "open" and "closed" states. [For the sake of illustration, the left-hand cell in FIGS. 3A and 3B is shown in the "closed" state, while the right-hand cell in FIGS. 3A and 3B is shown in the "open" state. However, unless multiple bottom or top electrodes are incorporated into the structure, all of the cells will be in the same state at the same time.] In some embodiments, a combination of varying high- and low-frequency driving signals can be used to cause the internal phase 232 to switch between an "open" and a "shuttered" state, e.g., as described in U.S. Pat. No. 11,579,510.

The EPID 320 can have other electrode 322 configurations besides those illustrated, including but not limited to, electrode 322 configurations discussed in the references above and other electrode configurations understood by those having ordinary skill in the electrophoretic display arts to be useful for the functions described herein.

The EPID 320 can optionally include various substrates, adhesive layers, protection layers, and other components that provide structural aspects of the EPID 320 without significantly impacting performance.

The electrodes 322 can be substantially transparent. In some cases, the electrodes 322 are composed of indium tin oxide. Typically the indium tin oxide is disposed on a light-transmissive substrate, such as a 1-5 mil PET. Rolls of PET-ITO are commercially available from a number of suppliers.

The particles 230/330 are typically white particles, though other color particles are contemplated, including black particles, primary color particles, secondary color particles, and other combinations of colored particles. The particles 230/330 can all have the same color or can have different colors. In some cases, the particles can be metal oxide particles. The particles 230/330 can be titanium dioxide.

The EPID 320 can operate in shutter mode. The shutter mode can include at least two states, typically a closed state and an open state. In certain cases, the EPID 320 in the closed state provides at least 40% visual light transmission and at most 40% visual light reflection and/or visual light scatter. In certain cases, the EPID 320 in the open state provides at least 60% visual light transmission and at most 30% visual light reflect and/or visual light scatter. These transmission and reflection/scatter values can be varied to achieve different effects.

The below features of the display devices 100, 200, 300 are described in the context of display device 200, but are equally applicable to display devices 100 or 300 unless the context clearly dictates otherwise. Reference numbers differing only by the digit in the hundreds place are either identical components or substantially similar components. References to EPIDs 220/320 are intended to be applicable to variable transmission media 120, unless the context clearly dictates otherwise.

The controller 250 is typically operably coupled to the EPID 220/320. In some cases, the controller 250 can be operably coupled to the emissive display 210. In some cases, the controller 250 can be operably coupled to the ambient light sensor 260.

The controller 250 is configured to control the state of the EPID 220/320 in a fashion understood by those having ordinary skill in the electrophoretic display arts, including the methods discussed in the patent publications discussed above.

The controller 250 can work in concert with the ambient light sensor 260 to provide a feedback loop for control of the EPID 220/320 and optionally for control of the emissive display 210. In some cases, the intensity of the measured ambient light is utilized in the feedback loop. In some cases, the spectral quality of the ambient light is utilized in the feedback loop. In some cases, both the intensity and the spectral quality of the ambient light is utilized in the feedback loop.

The controller 250 can vary the state of the EPID 220/320 alone, can vary the state of the emissive display 210 along, or can vary the state of both the EPID 220/320 and emissive display 210 to provide the desired effect. In some cases, the controller 250 directs the emissive display 210 to provide a desired video stream and modifies the appearance of that video stream by altering the state of the EPID 220/320.

The ambient light sensor 260 typically measures an intensity of ambient light. In some cases, the ambient light sensor 260 measures the spectral quality of ambient light. The ambient light sensor 260 provides a signal representative of the measurement. The signal can take any form known to those having ordinary skill in the signal processing arts. The signal can be routed to the controller 250 for use in the control discussed elsewhere herein. The ambient light sensor 260 can be a camera, a spectrophotometer, a photodiode, other sensors known by those having ordinary skill in the art to be suitable for measuring one or more properties of ambient light, combinations thereof, and the like. Typically, the ambient light sensor is a camera. In some cases, the ambient light sensor 260 is directly integrated into the display device 200 (for example, the front-facing camera of a personal device).

In one specific case, the controller 250 receives the signal from the ambient light sensor 260 and the signal indicates that the ambient light has changed. In response to the change, the controller 250 directs the EPID 220/320 to change the degree of shuttering. In some cases, the change is a change in intensity of the ambient light. In some cases, the change is a change in the quality (i.e., the color spectrum) of the ambient light. In some cases, the change involves intensity and quality of the ambient light. The controller 250 and ambient light sensor 260 can work in concert to monitor the ambient light periodically at a rate that is selected to be suitable for a given purpose. For example, in cases where the light conditions vary more quickly, the ambient light can be monitored more frequently, and vice versa.

The controller 250 can have stored within the controller 250 or on a separate memory that is accessible by the controller 250 an algorithm for determining which adjustment to make in response to a given change in ambient light conditions. A non-limiting example is outlined below, but others are contemplated. As one example, the controller 250 can be configured to uniformly adjust the EPID 220/320 to a more "open" state in response to higher intensity ambient light and to a more "closed" state in response to a lower intensity ambient light.

The controller 250 can be configured to direct the EPID 220/320 to provide a uniform degree of shuttering (i.e., the shutters are uniformly "open" or "closed" or some state in between those two states) or a spatially-varying degree of shuttering (i.e., the shutters are more or less "open" or "closed" in different parts of the EPID 220/320).

Display device 200/300 provides a desired altered image at viewing location 240 that is different than the image that would be at the viewing location 240 from only the emissive display 210 in the absence of the EPID 220/320. In some instances display device 200/300 produces an image at the viewing location 240 that is different from only the EPID 220/320 in the absence of the emissive display 210. In other words, the combination of emissive display 210 and EPID 220/320 provides a unique image at the viewing location 240. However, in many embodiments, the benefit is that the combined display 200/300 can provide e-paper like video displays. Additionally, as discussed below, the display device can be matched with a "conventional" electrophoretic display (EPD) to give the look of a larger format electrophoretic display with video capability.

In cases where the emissive display and the EPID 220/320 are not in direct contact with one another, the emissive display 110 and the variable transmission medium 120 may be separated by an air gap, a vacuum, a liquid, a filter, other useful optical components known to those having ordinary skill in the display arts, combinations thereof, and the like. In many embodiments, the emissive display 110 and the EPID 220/320 will be bonded together with an optically clear adhesive (OCA) such as those available from Norland Optical.

The emissive display 210 can be any emissive display known to those having ordinary skill in the emissive display arts. Typically, the emissive display 210 is an LCD display. The invention is suitable for use with other types of emissive display, such as light-emitting diode (LED) and organic light-emitting diode (OLED). In some cases, the emissive display 210 can be a personal device, such as a tablet or a smart phone.

The controller 250 can be configured to adjust the display properties of the emissive display 210, such as brightness, tone, color, and other conventional display settings known to those having ordinary skill in the art. In some cases, the emissive display 210 receives a video stream from one source (the source can be a part of display device 200 or separate from display device 200) and can receive settings instructions from the controller 250.

Figures 4A, 4B:
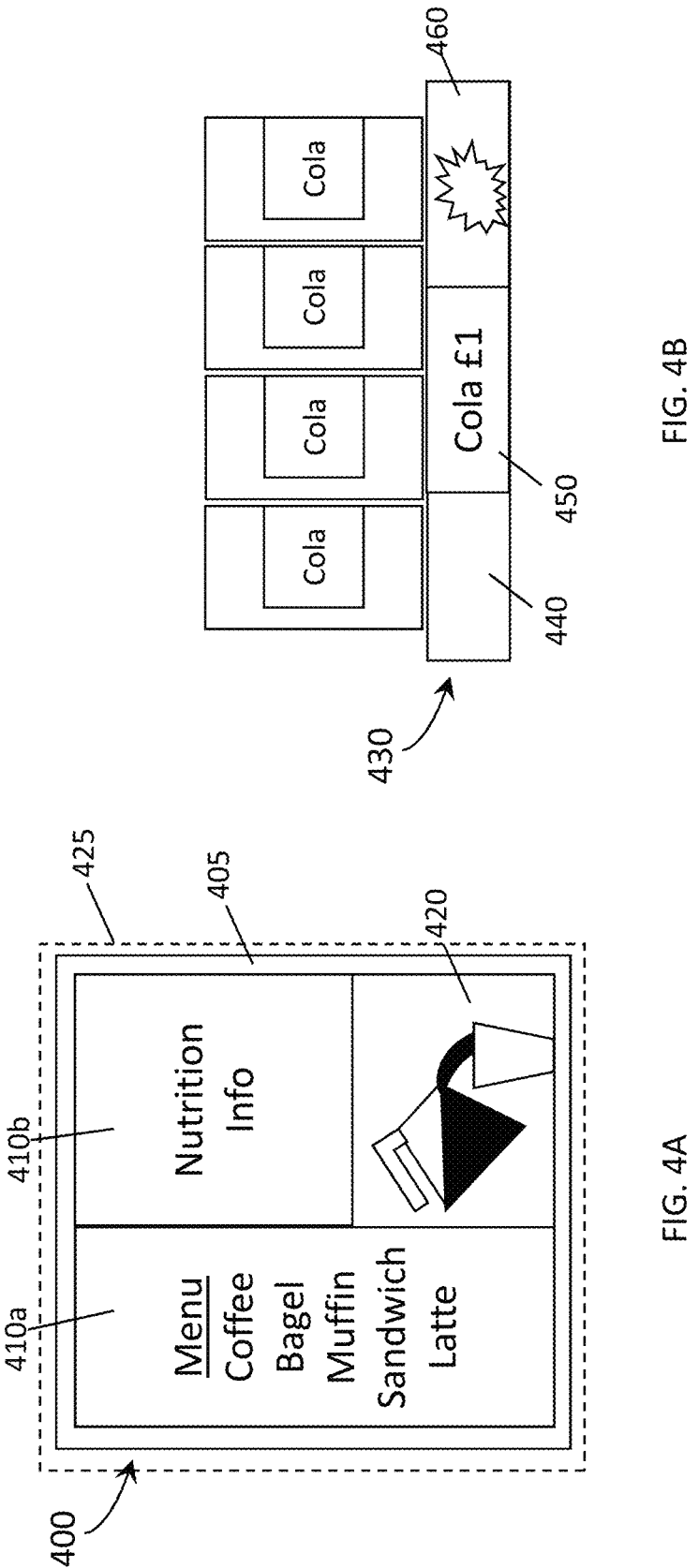
FIG. 4A illustrates a first use case for the invention in which a combination emissive display and variable transmission display are paired with "standard" electrophoretic displays to create a larger-format dynamic sign with reduced energy consumption as compared to a similar sized emissive display.
FIG. 4B illustrates a first use case for the invention in which a combination emissive display and variable transmission display are paired with "standard" electrophoretic displays to create a larger-format dynamic sign with reduced energy consumption as compared to a similar sized emissive display.

The benefits of a combination e-paper/hybrid display device of the invention 200/300 are illustrated in FIG. 4A. Such a combination display typically includes a hybrid display of the invention, i.e., including an emissive display with a variable transmission overlay and an e paper display, such as an electrophoretic display, coupled to the same substrate. For example a menu board 400 may include one or more e paper displays 410a, 410b, such as sold by the E Ink Corporation. E paper displays 410a, 410b, may be of a variety of sizes, and may include, for example, black and white displays, color displays, and color filter array displays. Greater details of such e paper displays 410a, 410b, are provided in many of the already-mentioned E Ink patent references above. As is well known, an advantage of e paper displays 410a, 410b is that they are bistable and consume virtually no power to maintain the same image. Accordingly, for a display similar to menu board 400, much of the content, which is not updated throughout the day, can be shown with an e paper display 410a, 410b, as shown in FIG. 4A. However, for a smaller portion of the display, a display device of the invention 420 can be used to show moving pictures, which could be for example an appealing video, or alternatively allow real time face-to-face interactions between a customer and an employee. Because the different components of the menu board 400 are blended together, and overall have the look of e paper, the menu board 400 is visually pleasing. Additionally, because only a small portion of the menu board employs an LCD screen, the overall power consumption is greatly reduced when compared to using the equivalent size LCD screen, whereby all of the content is delivered via the LCD screen even through much of it is constant throughout the day. The e paper displays 410a, 410b and the hybrid display device of the invention 420 are coupled to the same substrate 405. The substrate 405 can be any suitable construction material such as wood, plastic, or metal. In some embodiments, a protective sheet 425 is placed over all the components (410a, 410b, 420) and sealed to the substrate 405 to protect the menu board 400 against rain, heat, humidity, and sunlight. Such a protective sheet may include a light-transmissive polymer, such as polyacrylate, polyimide, polyurethane, or polyethylene.

A second example of the benefits of a combination e-paper/hybrid display device of the invention 200/300 is shown in FIG. 4B. A hybrid shelf label 430 includes a substrate 440 with both a conventional e-paper display 450 and a display device of the invention 460. Again, because the product name and the price are not changed more than once a day, this information can be shown with very little energy cost on the conventional e-paper display. A display device of the invention can be used to show dynamic content, which could be something eye-catching and intended to influence a consumer. Because the conventional e-paper display 450 and a display device of the invention 460 both have an e-paper appearance, the overall visual experience is pleasing and not as jarring as a naked LCD shelf label.

Optical performance of the display devices described herein, including those in the example below, can be predicted by measuring the display's emissive and reflective characteristic and modeling of the ambient light environment, such as described in J. Penczek, D. Hertel, "Developing E-paper Standards for the Mobile Age," SID Digest 45:865-868 (2014), DOI: 10.1002/j.2168-0159.2014.tb00228.x., which is incorporated herein in its entirety by reference. Using these methods or similar methods, the controller 250 can predictably provide a given adjusted image and can implement the feedback loop to predictably account for varying levels or quality of ambient light.

The total observed spectral radiance $LT,Q(\lambda)$ of a display that is set to the color Q is the sum of the display emission $LE,Q(\lambda)$ and the contribution of ambient illumination reflected off the display $LR, Q(\lambda)$ so that $LT,Q(\lambda)=LE,Q(\lambda)+LR,Q(\lambda)$.

If a shuttering EPD is laminated to the LCD surface, the emissive component of the backlit LCD $LE\ LCD,Q(\lambda)$ will be attenuated by the EPD's spectral transmission depending on its switching states (T #EPD,open or T #EPD, closed) so that $LE,Q(\lambda)=LE\ LCD,Q(\lambda)$. T #EPD($\lambda$).

The reflectance of an LCD is designed to be low so that disturbing reflection of the ambient viewing environment is kept to a minimum. For example, the reflection of diffuse light is typically less than 10%, the reflectance of directed light less than 1%, as described in D. Hertel, E. F. Kelley, "Viewing Direction Measurements with Hemispherical Diffuse Illumination on E-Paper Displays," SID Digest 45:532-535 (2014), DOI: 10.1002/j.2168-0159.2014.tb00139.x., which is incorporated herein in its entirety by reference. The shuttering EPD layer mounted on top of the LCD will have much higher reflectance than the LCD display itself. As a result, the shuttering EPD layer will dominate the PLD's total reflection of ambient light, and thus increase it to levels that appear more paper-like. For a diffuse lighting environment, the spectral radiance or luminance $LR,Q(\lambda)$ of ambient light $Eamb(\lambda)$ reflected off the PLD will be $$L_{R,Q}(\lambda) = E_{amb}(\lambda)\frac{R\#_{EPD}(\lambda) + R\#_{LCD,Q}(\lambda) \cdot T\#^2_{EPD}(\lambda)}{\pi}$$

where R #LCD, Q($\lambda$) is the diffuse reflectance of the LCD displaying the color Q, T #EPD($\lambda$) and R #EPD($\lambda$) the diffuse transmittance and reflectance of the shuttering EPD. Of the two spectral radiance components LE,Q ($\lambda$) and LR,Q($\lambda$) contributing to the total display spectral radiance only the reflective component LR, Q($\lambda$) depends on the ambient lighting Eamb($\lambda$). This yields two parameters to control total spectral radiance LT($\lambda$) of the PLD so that it appears paper-like: level and spectrum of ambient lighting Eamb($\lambda$), and the switching state T #EPD($\lambda$) and R #EPD($\lambda$) of the EPD.

EXAMPLE

Figure 5:
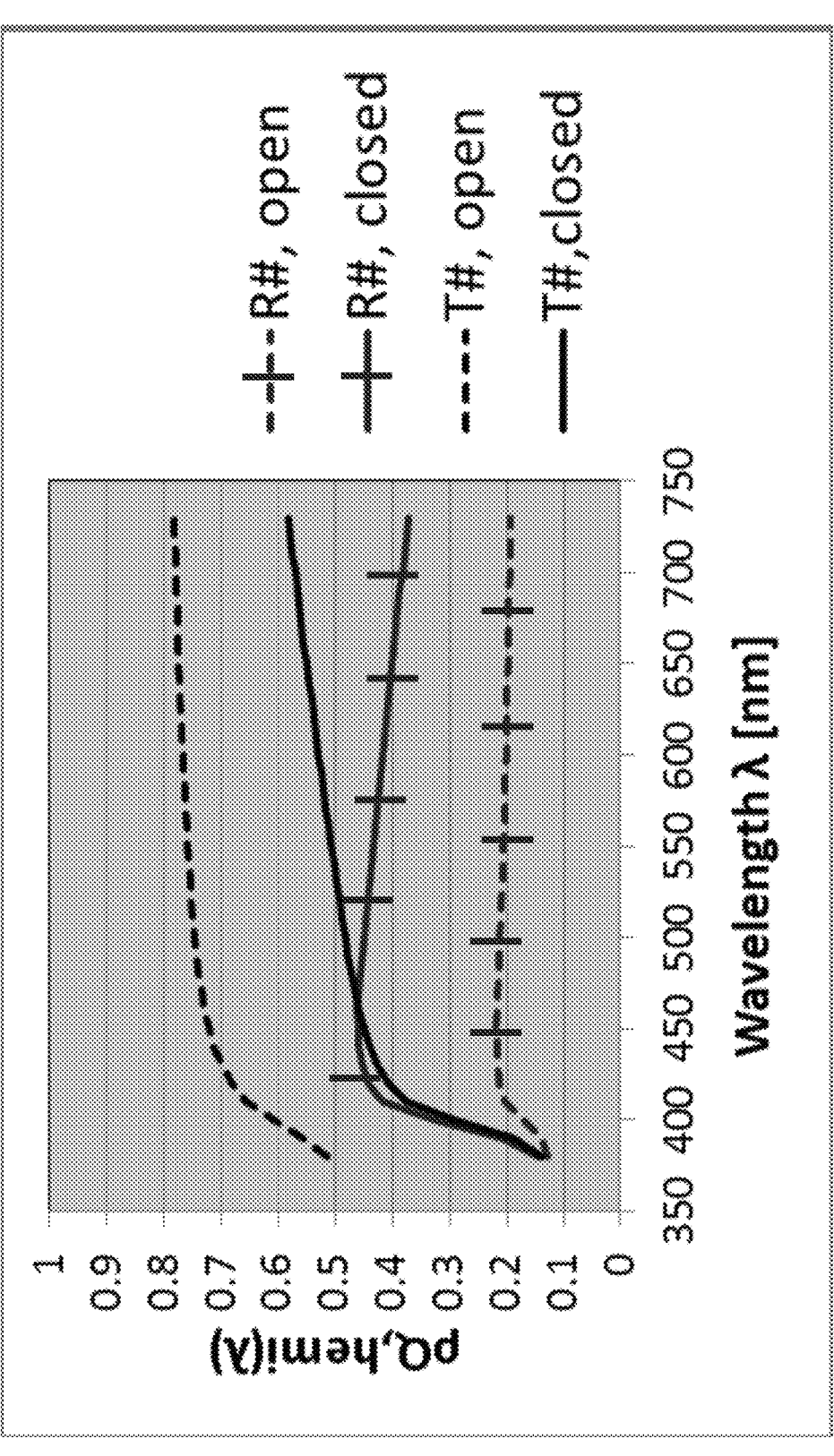
FIG. 5 is a plot of diffuse reflectance and transmittance of a shuttering electrophoretic layer in open and closed states, as discussed in the Example.

A variable transmission EPD layer was laminated to the front of a backlit LCD color display to create a display device (referred to elsewhere as a "paper-like display" or "PLD"). The EPD layer contained white, light-scattering titania pigment that was switchable horizontally into or out of the optical path such that the EPD acts as an optical shutter. The two switching states can be characterized by measuring diffuse reflectance R #($\lambda$) and diffuse transmittance T #($\lambda$). FIG. 5 shows spectral distributions of reflectance R #EPD,open ($\lambda$), R #EPD,closed ($\lambda$) and transmittance T #EPD,open ($\lambda$), T #EPD,closed ($\lambda$) measured with a Cary 5000 spectrophotometer and Diffuse Reflectance Accessory (DRA). In the closed state, about 50% of incident light was scattered back and about 50% transmitted. In the open state, more than about 70% of the incident light was transmitted by the white pigment now concentrated to a minimum area still scattered back about 20% of the incident light.

Figure 6:
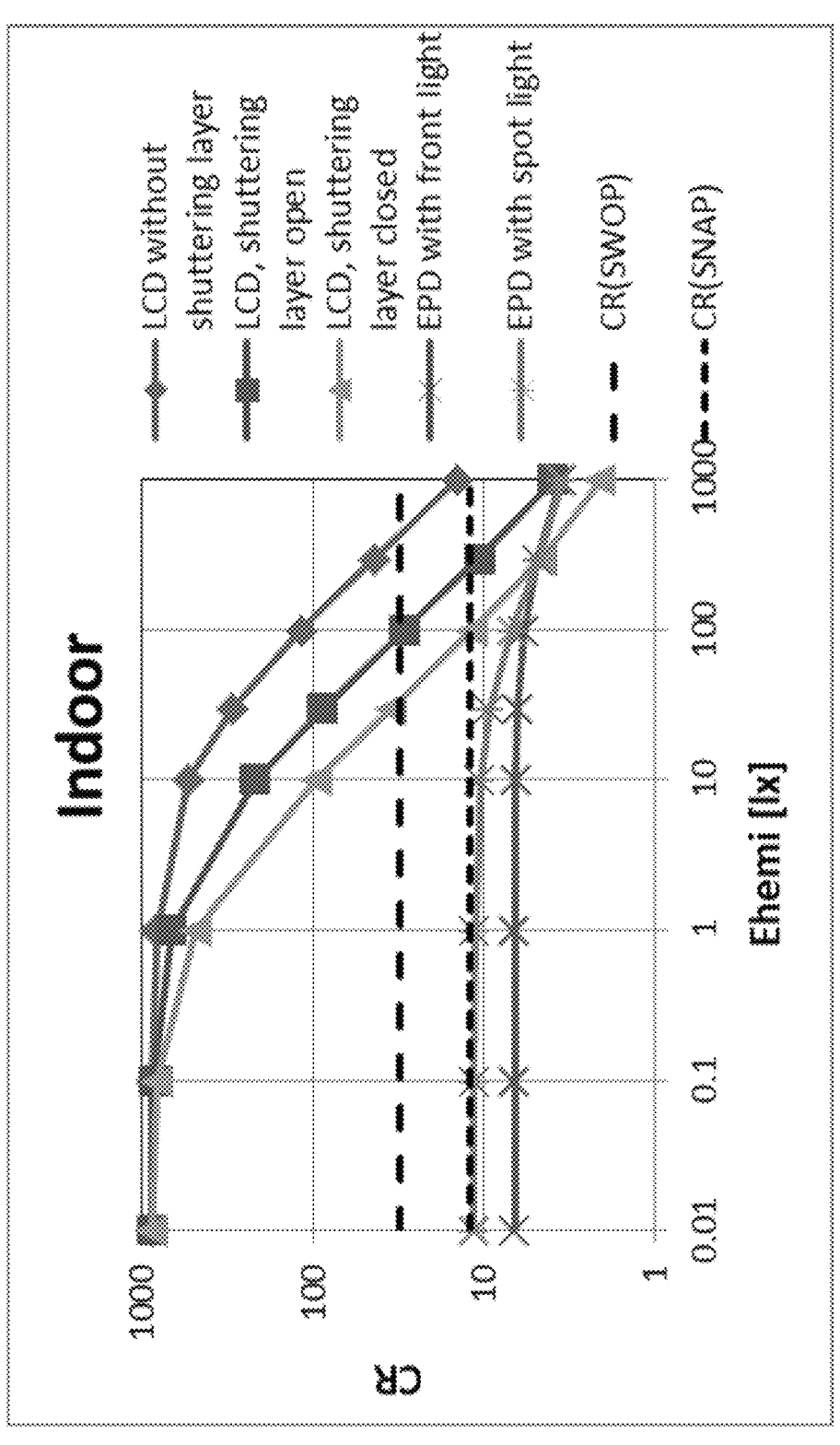
FIG. 6 is a plot of contrast ratio for different levels of diffuse ambient illumination for an LCD display without and with a shuttering electrophoretic display layer in open and closed switching states and an electrophoretic color filter array color display having spot lighting or front lighting. The plot also shows the print specifications SWOP and SNAP.

The spectral emission LE, Q($\lambda$) of the display set to a display color Q was measured in a darkroom with a spectroradiometer Konica-Minolta CS-2000 for the colors Q white, black, the LCD's primary colors red green blue, and mixtures of pairs of primary colors cyan, magenta, yellow. Colorimetry known in the art was used to calculate contrast ratio CR and color gamut from the total spectral radiance distributions LT,Q($\lambda$) of the PLD at each display color Q. First, for each color Q, the effective tri-stimulus values (X, Y, Z)Q were calculated from LT,Q($\lambda$). The contrast ratio CR was calculated from the luminance YQ of the display at the colors Q=white and Q=black, FIG. 6 shows the contrast ratio for different levels of diffuse ambient illumination (in lx) for LCD display without and with shuttering EPD layer in open and closed switching states, compared with an EPD with colored-filter array color display having spot or front lighting, and the print specifications SWOP and SNAP. With increasing levels or ambient illumination, the shuttering layer decreases the CR from its high darkroom level of almost 1,000. At typical dim indoor illuminance levels (30-300 lx), the CR of the LCD with shuttering layer was predicted to be reduced to levels below 100, a range associated with print (SWOP and SNAP specification) or e-paper displays.

Figure 7:
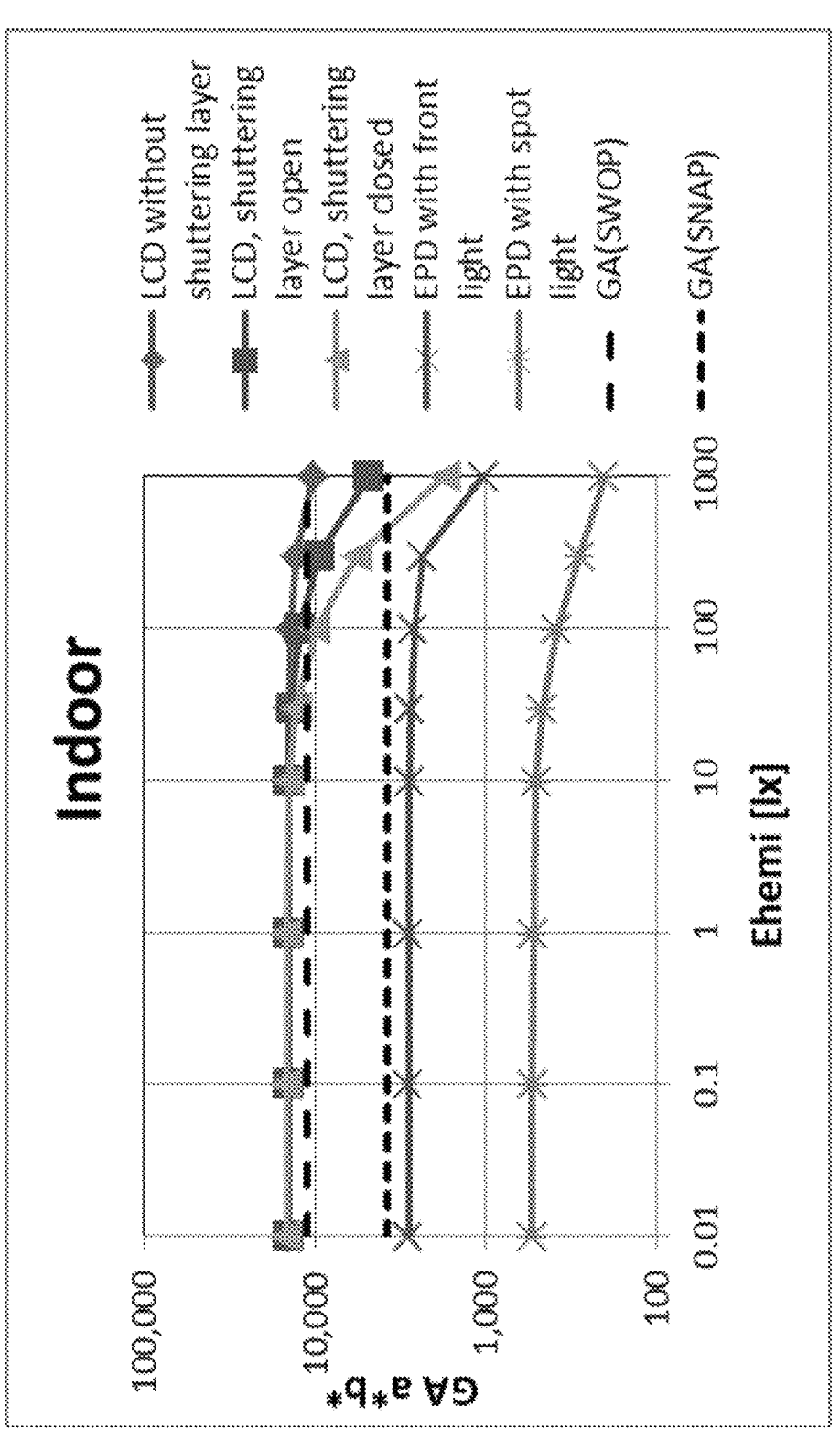
FIG. 7 is a plot of gamut area in the CIE a*b* plane for different levels of diffuse ambient illumination for an LCD display without and with a shuttering electrophoretic display layer in open and closed switching states and an electrophoretic color filter array color display having spot lighting or front lighting. The plot also shows the print specifications SWOP and SNAP.
Figure 8:
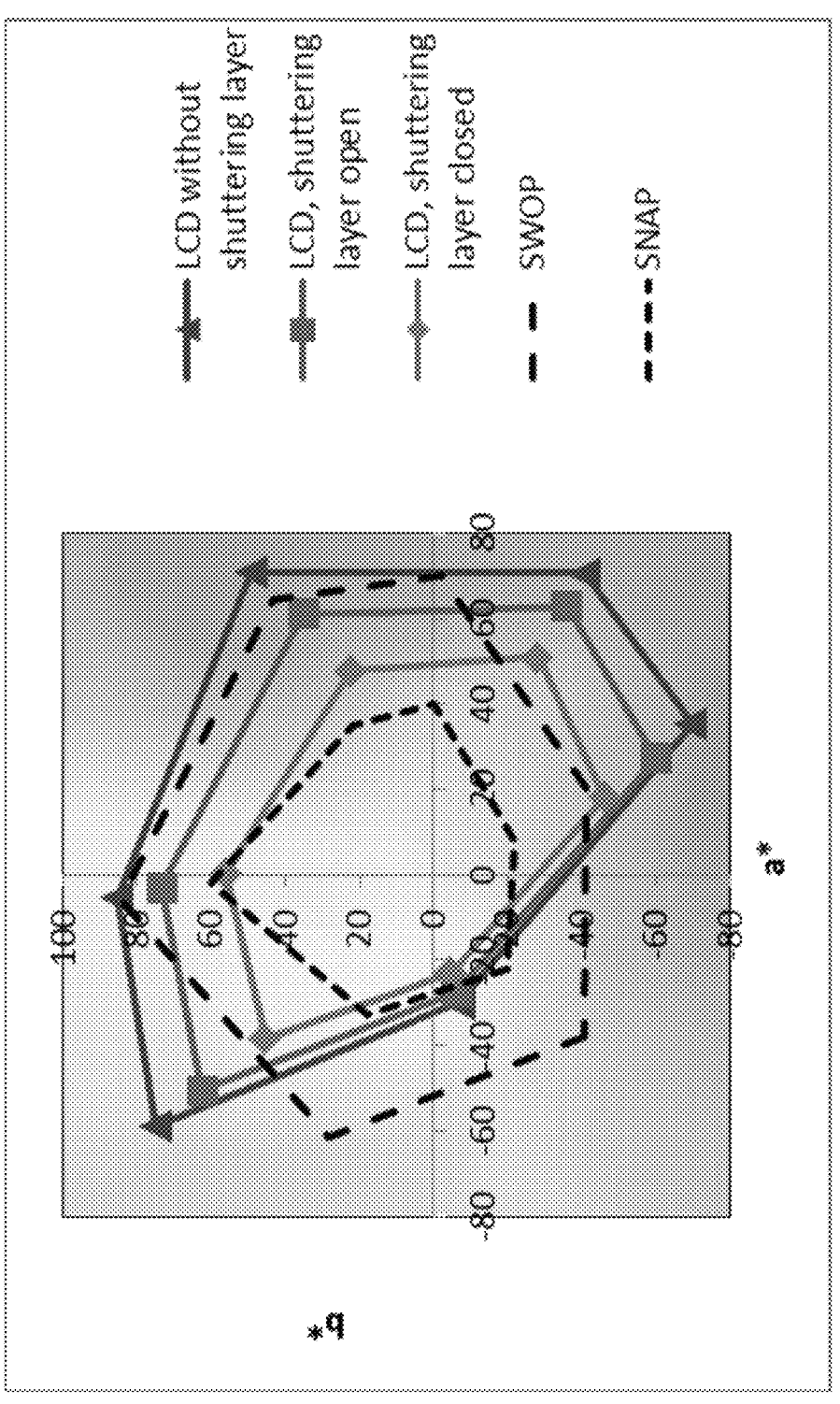
FIG. 8 is a plot of gamut areas in the CIE a*b* plane at 300 lx of diffuse ambient illumination for an LCD display without a scattering layer and an LCD display with a scattering layer in open and closed configuration. The plot also shows the print specifications SWOP and SNAP.

FIG. 7 shows the Gamut area in the CIE a*b* plane calculated from the effective tri-stimulus values (X, Y, Z)Q for a set of 6 display colors Q (blue, cyan, green, yellow, red, magenta) calculated for different levels of diffuse ambient illumination (in lx) for LCD display without and with shuttering EPD layer in open and closed switching states, and compared with the gamut areas of an EPD CFA color display having spot or front lighting. Hemispherical-diffuse ambient lighting above 30 lx starts to reduce the color gamut of the display from its high darkroom level, but at typical indoor lighting levels between 30 lx and 1,000 lx it stays within the range associated with print (SWOP and SNAP), well above the gamut of the EPD with CFA. This clearly shows the advantage of the proposed PLD that combines a backlit LCD with a shuttering ink layer: while the contrast is reduced to paper-like levels, the display remains much more colorful compared to an e-paper display with CFA. Its predicted color performance is close to that of printed paper. FIG. 8 shows how the gamut areas in the CIE a*b* plane at a fixed 300*lx* of diffuse ambient illumination can be controlled by the switching states of the scattering layer. The gamut areas for the LCD without the scattering layer, and for the print specifications SWOP and SNAP are included as benchmarks.

Figure 9:
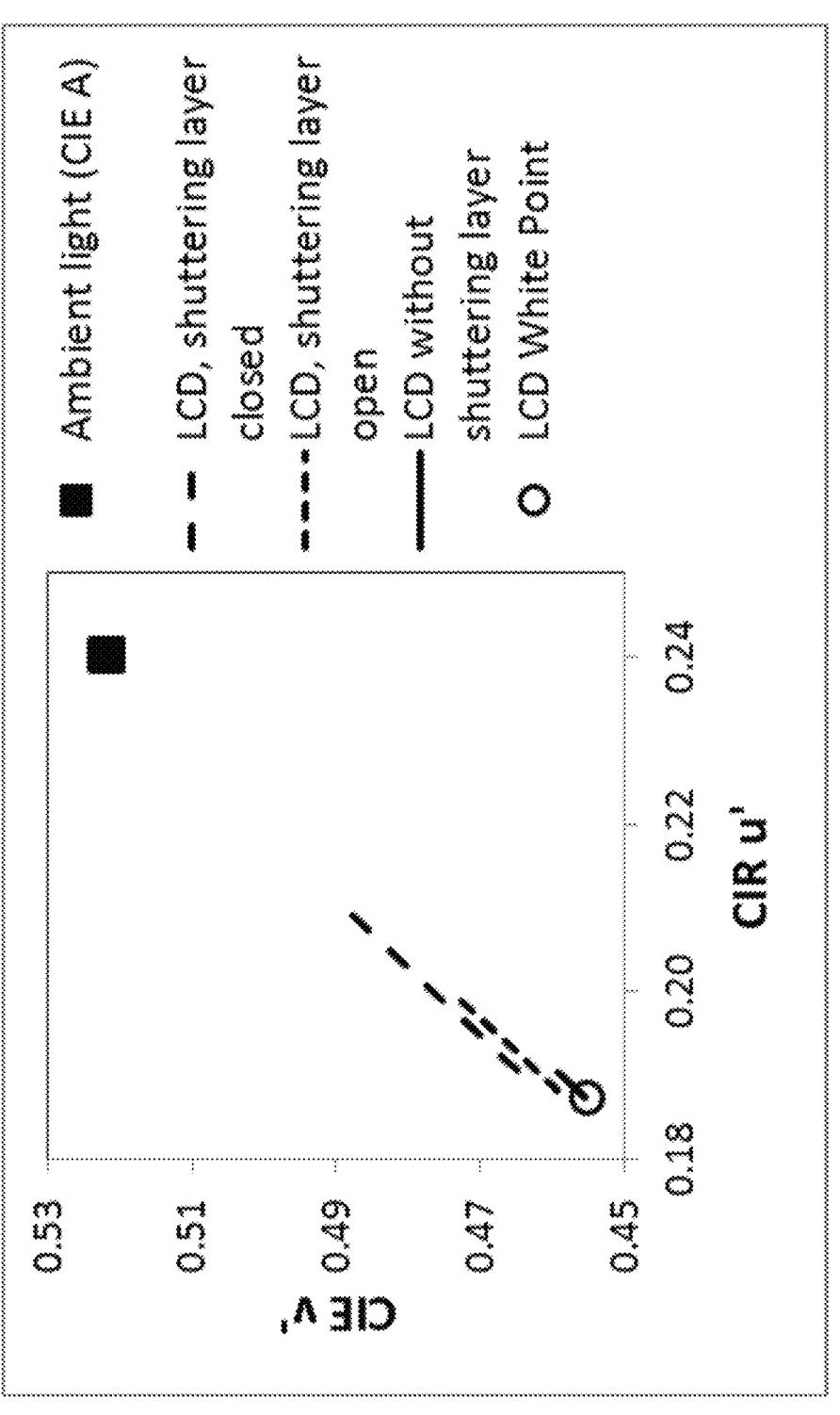
FIG. 9 is a plot illustrating the shifting of the white point of an LCD display toward the warmer white point of ambient light by adjusting the properties of the scattering layer, as discussed in the Example.

FIG. 9 demonstrates how the reflective properties of the scattering layers can be used in concert with controlled ambient illumination to control the white point of the paper like display. The reflective properties of the scattering layer are utilized to shift the white point of the display from that of the LCD (bluish) towards the white point of the ambient light (CIE illuminant A). The scattering layer is most effective in the closed state.

The present disclosure has described one or more preferred embodiments, and it should be appreciated that many equivalents, alternatives, variations, and modifications, aside from those expressly stated, are possible and within the scope of the invention.

The invention claimed is:

1. A hybrid display device comprising:
an emissive display having at least one emission surface from which an image is displayed to be viewable from a viewing location;
a variable transmission electrophoretic display positioned between the emissive display and the viewing location to at least partially alter the image at the viewing location, the variable transmission electrophoretic display comprising an internal phase comprising a plurality of charged white particles disposed in a fluid; and
a controller operably coupled to the variable transmission electrophoretic display, the controller configured to adjust a state of the variable transmission electrophoretic display to generate a desired altered image to be viewable from the viewing location,
wherein the variable transmission electrophoretic display is configured to operate in a shutter mode that includes a closed state and an open state, wherein the closed state provides at least 40% transmission and at most 40% visual light reflection and/or visual light scatter, wherein the open state provides at least 60% visual light transmission and at most 30% visual light reflection and/or visual light scatter.

2. The hybrid display device of claim 1, wherein an optically-clear adhesive layer is disposed between the emissive display and the variable transmission electrophoretic display.

3. The hybrid display device of claim 1, further comprising an ambient light sensor.

4. The hybrid display device of claim 3, wherein the controller is operably coupled to the ambient light sensor.

5. The hybrid display device of claim 4, wherein the controller is configured to receive a signal from the ambient light sensor and, in response to receiving the signal, adjust the transmission of the variable transmission electrophoretic display.

6. The hybrid display device of claim 5, wherein the ambient light sensor measures an intensity of ambient light and a spectrum of ambient light.

7. The hybrid display device of claim 1, wherein the charged white particles comprise titania.

8. The hybrid display device of claim 1, wherein the internal phase is encapsulated in gelatin microcapsules.

9. The hybrid display device of claim 1, wherein the internal phase is encapsulated in microstructures and sealed with a sealing layer.

* * * * *